(12) United States Patent
Ji et al.

(10) Patent No.: US 11,316,438 B2
(45) Date of Patent: *Apr. 26, 2022

(54) POWER SUPPLY MODULE AND MANUFACTURE METHOD FOR SAME

(71) Applicant: Delta Electronics (Shanghai) Co., Ltd., Shanghai (CN)

(72) Inventors: Pengkai Ji, Shanghai (CN); Shouyu Hong, Shanghai (CN); Xiaoni Xin, Shanghai (CN); Le Liang, Shanghai (CN); Zhenqing Zhao, Shanghai (CN)

(73) Assignee: DELTA ELETRONICS (SHANGHAI) CO., LTD., Shanghai (CN)

( * ) Notice: Subject to any disclaimer, the term of this patent is extended or adjusted under 35 U.S.C. 154(b) by 97 days.

This patent is subject to a terminal disclaimer.

(21) Appl. No.: 16/729,472

(22) Filed: Dec. 29, 2019

(65) Prior Publication Data
US 2020/0220473 A1    Jul. 9, 2020

(30) Foreign Application Priority Data

Jan. 7, 2019 (CN) .......................... 201910013087.9
Aug. 28, 2019 (CN) .......................... 201910800132.5

(51) Int. Cl.
*H01L 25/11* (2006.01)
*H01L 23/498* (2006.01)
(Continued)

(52) U.S. Cl.
CPC ......... *H02M 7/003* (2013.01); *H01M 50/579* (2021.01); *H02J 9/005* (2013.01)

(58) Field of Classification Search
CPC .... H02J 9/005; H02M 7/003; H02M 3/33576; H02M 3/003; H02M 1/0058;
(Continued)

(56) References Cited

U.S. PATENT DOCUMENTS 5,111,278 A    5/1992  Eichelberger
5,552,633 A *  9/1996  Sharma .............. H01L 25/0652
                                                      257/700
(Continued)

FOREIGN PATENT DOCUMENTS

CN    101038880 A    9/2007
CN    101330075 A   12/2008
(Continued)

OTHER PUBLICATIONS

Corresponding China office action dated May 24, 2021.
(Continued)

*Primary Examiner* — Jared Fureman
*Assistant Examiner* — Esayas G Yeshaw
(74) *Attorney, Agent, or Firm* — CKC & Partners Co., LLC

(57) ABSTRACT

The present disclosure provides a power supply module and a manufacture method thereof, belonging to the technical field of power electronics. According to the present disclosure, a unibody conductive member is employed to connect a conductive part in a passive element to a conductive layer in a substrate. This is advantageous in simplifying the structure of the passive element, and enabling a structurally compact power supply module at a reduced cost. Additionally, stacking the passive element with the substrate may allow for a further compact structure for the power supply module, improving the space utilization rate for the power supply module, while enhancing the external appearance of the power supply module with tidiness, simplicity and aesthetics.

20 Claims, 19 Drawing Sheets

(51) Int. Cl.
  *H01L 23/00* (2006.01)
  *H02M 7/00* (2006.01)
  *H02J 9/00* (2006.01)
  *H01M 50/579* (2021.01)

(58) Field of Classification Search
  CPC ....... H02M 3/337; H02M 3/158; Y02E 60/10; H01M 50/579; H01M 50/20; H01M 10/04; Y02B 70/10
  See application file for complete search history.

(56) References Cited

U.S. PATENT DOCUMENTS

| | | | |
|---|---|---|---|
| 6,627,984 | B2 | 9/2003 | Bruce et al. |
| 6,806,580 | B2 | 10/2004 | Joshi et al. |
| 7,173,333 | B2 | 2/2007 | Hata et al. |
| 8,736,040 | B2 | 5/2014 | Hauenstein et al. |
| 9,129,933 | B2 | 9/2015 | Yamamoto et al. |
| 10,211,158 | B2 | 2/2019 | Hohlfeld et al. |
| 10,418,895 | B2 | 9/2019 | Otake |
| 10,868,229 | B2 | 12/2020 | Son et al. |
| 11,063,525 | B2 * | 7/2021 | Ji ..................... H01M 50/20 |
| 2001/0007287 | A1 | 7/2001 | Hoche |
| 2005/0161785 | A1 | 7/2005 | Kawashima et al. |
| 2006/0232942 | A1 | 10/2006 | Nakatsu et al. |
| 2010/0194511 | A1 | 8/2010 | Kobayashi et al. |
| 2011/0127678 | A1 | 6/2011 | Shim et al. |
| 2012/0014059 | A1 | 1/2012 | Zeng et al. |
| 2012/0161128 | A1 | 6/2012 | Macheiner et al. |
| 2013/0049137 | A1 | 2/2013 | Uno et al. |
| 2013/0094269 | A1 | 4/2013 | Maeda et al. |
| 2014/0017557 | A1 * | 1/2014 | Lockett ............... H01M 50/431 429/189 |
| 2015/0055306 | A1 | 2/2015 | Burns et al. |
| 2015/0145145 | A1 * | 5/2015 | Tsuyutani ............ H01L 21/561 257/774 |
| 2015/0200050 | A1 | 7/2015 | Nakao et al. |
| 2016/0126192 | A1 | 5/2016 | Hohlfeld et al. |
| 2016/0284789 | A1 | 9/2016 | Zuo et al. |
| 2017/0018348 | A1 | 1/2017 | Mak et al. |
| 2017/0062121 | A1 | 3/2017 | Yang et al. |
| 2017/0064808 | A1 | 3/2017 | Rizza et al. |
| 2017/0200756 | A1 * | 7/2017 | Kao ..................... H01L 23/481 |
| 2017/0373133 | A1 | 12/2017 | Liao |
| 2018/0096780 | A1 | 4/2018 | Sekiguchi et al. |
| 2018/0102349 | A1 | 4/2018 | Cho |
| 2018/0130595 | A1 | 5/2018 | Choi et al. |
| 2018/0182945 | A1 | 6/2018 | Shimabukuro |
| 2018/0204741 | A1 | 7/2018 | Chew |
| 2019/0221521 | A1 | 7/2019 | Hohlfeld et al. |
| 2021/0091054 | A1 * | 3/2021 | Apelsmeier ........... H01L 25/074 |

FOREIGN PATENT DOCUMENTS

| | | |
|---|---|---|
| CN | 101378049 A | 3/2009 |
| CN | 101414602 A | 4/2009 |
| CN | 101790766 A | 7/2010 |
| CN | 101840769 A | 9/2010 |
| CN | 201655476 U | 11/2010 |
| CN | 102369790 A | 3/2012 |
| CN | 103298258 A | 9/2013 |
| CN | 103383891 A | 11/2013 |
| CN | 103681535 A | 3/2014 |
| CN | 103730434 A | 4/2014 |
| CN | 103887292 A | 6/2014 |
| CN | 104051363 A | 9/2014 |
| CN | 204348470 U | 5/2015 |
| CN | 104756611 A | 7/2015 |
| CN | 105575943 A | 5/2016 |
| CN | 105679738 A | 6/2016 |
| CN | 107006118 A | 8/2017 |
| CN | 107086212 A | 8/2017 |
| CN | 107919350 A | 4/2018 |
| CN | 108231607 A | 6/2018 |
| CN | 108962773 A | 12/2018 |
| EP | 2482312 A2 | 8/2012 |
| JP | 2014168038 A | 9/2014 |
| KR | 970007127 B1 | 5/1997 |
| TW | 201537722 A | 10/2015 |

OTHER PUBLICATIONS

Corresponding India office action dated Apr. 7, 2021.
Corresponding China office action dated May 31, 2021.
Corresponding China office action dated Jun. 3, 2021.
Corresponding US office action dated Mar. 19, 2021.
Corresponding US Notice of Allowance dated Mar. 18, 2021.
Corresponding India office action dated Aug. 31, 2021.
Corresponding India office action dated Oct. 25, 2021.
Office Action of U.S. Appl. No. 16/735,716 dated Sep. 10, 2021.
Corresponding China office action dated Jul. 21, 2021.
Corresponding China Notice of Allowance dated Jan. 20, 2022.

* cited by examiner

POWER SUPPLY MODULE AND MANUFACTURE METHOD FOR SAME

CROSS-REFERENCE TO RELATED APPLICATION

This application claims priority to Chinese Patent Application No. 201910013087.9, filed on Jan. 7, 2019, and Chinese Patent Application No. 201910800132.5, filed on Aug. 28, 2019, both of which are hereby incorporated by reference in their entireties.

TECHNICAL FIELD

The present disclosure relates to a power supply module and a manufacture method thereof, belonging to the technical field of power electronics.

BACKGROUND

A power supply module is used to output an electric current for use by other electronic components or devices, and typically includes an energy storage element (e.g., a capacitor or inductor) and a substrate (e.g., a PCB board). In an existing manufacturing process for power supply modules, passive elements from different manufacturers are soldered onto a substrate before being assembled with other components. However, since such an existing assembling process requires that individual passive elements be soldered onto individual substrates, not only shall leads and pads for the soldering be reserved on the passive elements and the substrates, but also sufficient process tolerance and process clearance shall be reserved for a soldering operation, leading to a bloated size for the assembled power supply module. Over the years, the industry has been focusing on improving the craftsmanship in the process to reduce the process tolerance and process clearance in soldering. The footprint required for soldering individual components has been shrunk to its extreme, yet still falling short of the ever escalating demand for more downsizing.

SUMMARY

The present disclosure provides a power supply module and a manufacture method thereof, which can overcome the existing problems described above.

In a first aspect of the present disclosure, a power supply module is provided, including: a substrate, a passive element and a unibody conductive member, where a conductive layer is formed in the substrate; the passive element and the conductive layer are provided in a stacking manner, the passive element including a conductive part and an energy storage part; and the conductive member penetrates through a surface of the energy storage part facing the conductive layer, and the conductive member is in contact with the conductive part and the conductive layer respectively.

In another aspect of the present disclosure, a manufacture method of a power supply module according to any of the foregoing description is provided, including: providing a substrate including a conductive layer; stacking the conductive layer with the passive element, the passive element including a conductive part and an energy storage part; providing a first groove connected the conductive layer and the conductive part; and forming within the first groove a unibody conductive member for electrically connecting the conductive layer with the conductive part, where the conductive member penetrates through a surface of the energy storage part facing the conductive layer, and the conductive member is in contact with the conductive part and the conductive layer respectively.

Advantages of additional aspects of the present disclosure will be set forth in part in the description which follows, and some advantages will become apparent from the following descriptions, or be acquired in practicing the present disclosure.

BRIEF DESCRIPTION OF DRAWINGS

With reference to the following descriptions about the attached drawings, the above and other objectives, features and advantages of the embodiments of the present disclosure will become more comprehensible. In the drawings, various embodiments of the present disclosure will be described illustratively rather than restrictively, in which:

FIG. 4b is a sectional view taken along A-A in FIG. 4a;

FIG. 8b is a sectional view taken along A-A in FIG. 8a;

DETAILED DESCRIPTION OF EMBODIMENTS

Figure 1:
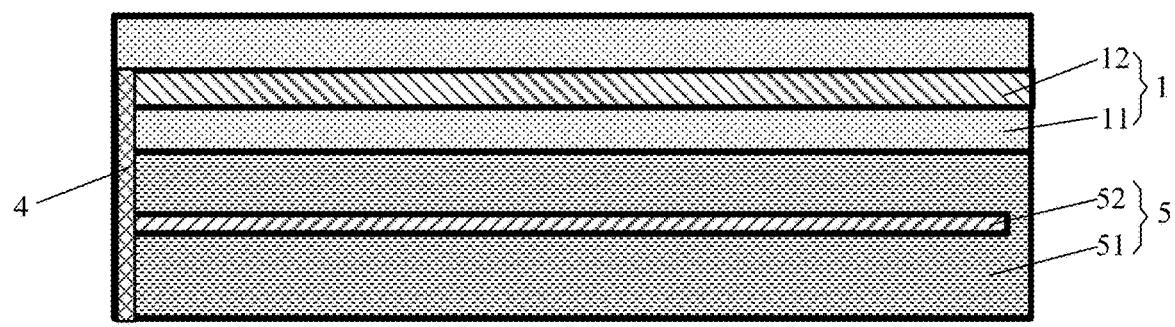
FIG. 1 is a sectional view of a first power supply module according to an embodiment of the present disclosure.

The embodiments of the present disclosure will be described in detail below, and examples of the embodiments are illustrated in the drawings, where the same or similar reference numerals are used to refer to the same or similar elements, or elements having the same or similar functions. The embodiments described below with reference to the drawings are exemplary, which are intended to be illustrated the present disclosure, rather than to be construed as limiting the present disclosure.

It should be understood that the following embodiments do not limit an execution sequence for various steps in the method that the present disclosure seeks to protect. Rather, various steps in the method of the present disclosure can be executed in any possible sequence and in a cycle, as long as no contradiction occurs.

In the description of the present disclosure, it is to be understood that the terms such as "center", "longitudinal", "transverse", "length", "width", "thickness", "up", "down", "front", "back", "left", "right", "vertical", "horizontal", "top", "bottom", "inside", "outside", "clockwise", "counterclockwise", "axial direction", "radial direction", "circumferential direction" and the like indicate orientational or positional relationships which are based on the drawings for the mere purpose of facilitating and simplifying the description of the present disclosure, rather than indicating or implying that an indicated device or element must have a particular orientation or be configured and/or operated in a particular orientation, and which hence may not be construed as limiting the present disclosure.

In addition, the terms such as "first" and "second" are used for descriptive purposes only and are not to be construed as indicating or implying a relative importance or implicitly indicating the number of technical features being indicated. Thus, features defined with "first" and "second" may explicitly indicate or implicitly include at least one of the features. In the description of the present disclosure, "a plurality of" means at least two, such as two, three, etc., unless specifically defined otherwise.

Unless explicitly stated and defined otherwise, in the present disclosure, the terms such as "installed", "coupled", "connected", "fixed" and the like shall be understood broadly, e.g., they may indicate a fixed connection, a detachable connection, a one-piece, a mechanical, electrical or mutually communicative connection, a direct connection, an indirect connection via a medium, a communication within two elements or an interaction between two elements, unless explicitly defined otherwise. For those of ordinary skill in the art, specific meanings of the above terms in the present disclosure can be understood according to particular cases.

Unless explicitly stated and defined otherwise, in the present disclosure, when a first feature is "above" or "under" a second feature, the first feature may be in direct contact with the second feature, or the first feature may be in indirect contact with the second feature via a medium. Additionally, when a first feature is "above", "over" or "on" a second feature, the first feature may be straightly in the upper of the second feature or deviate by an angle, or the first feature is simply at an altitude higher than the second feature. When a first feature is "below", "beneath" or "under" a second feature, the first feature may be straightly in the lower of the second feature or deviate by an angle, or the first feature is simply at an altitude lower than the second feature.

In the description of the present specification, the description with reference to the terms such as "an embodiment", "some embodiments", "example", "specific example", "some examples" or the like means a specific feature, structure, material or characteristics described in connection with the embodiment or example is included in at least one embodiment or example of the present disclosure. In the present specification, a schematic representation of the above terms is not necessarily directed to the same embodiment or example. Furthermore, the specific feature, structure, material or characteristics described may be combined in a suitable manner in any one or more embodiments or examples. In addition, different embodiments or examples or features thereof described in the present specification may be combined if no conflict is thus created.

As shown in FIG. 1, a power supply module includes a passive element 1, a substrate 5 and a unibody conductive member 4. A conductive layer 52 is formed in the substrate 5. The passive element 1 and the conductive layer 52 are provided in a stacking manner, the passive element 1 including an energy storage part 11 and a conductive part 12. The substrate 5 includes a main insulator 51 made from an insulated packaging material, and the conductive layer (trace) 52 located therein. The unibody conductive member 4 penetrates through a surface of the energy storage part 11 facing the conductive layer 52 and electrically connects the conductive part 12 in the passive element 1 to the conductive layer 52 in the substrate 5.

The passive element 1 may be embedded in the substrate 5. Alternatively, the passive element 1 may also be attached to the surface of the substrate 5, i.e., the passive element 1 may also be provided out of the substrate 5. In some examples, the conductive member 4 may be provided on a lateral side of the power supply module. Illustratively, a first groove connected the conductive part 12 and the conductive layer 52 may be provided on a lateral side of the power supply module, where the conductive member may be provided in the first groove. In some examples, the conductive member 4 may be provided within the power supply module. Illustratively, the power supply module may be provided with an inner bore connected the conductive part 12 and the conductive layer 52, with the conductive member 4 being provided in the inner bore. It should be noted that the "inner" herein is a relative term. That is, relative to the conductive member 4 being provided on the lateral side of the power supply module, the conductive member 4 provided in the inner bore is provided within the power supply module.

In some examples, there may be a plurality of conductive members 4. For instance, the conductive member 4 may include a first conductive member and a second conductive member which are oppositely arranged. At this instance, the conductive layer 52 may be in contact with at least one of the first conductive member and the second conductive member. In some examples, there may be a plurality of conductive layers 52. For instance, the conductive layer 52 may include a first conductive layer and a second conductive layer, where the first conductive layer is in contact with the first conductive member, and the second conductive layer may be in contact with the second conductive member.

Of course, the number and arrangement of the conductive members 4 and the conductive layers 52 are not limited to the above, and the present embodiment merely serves as an illustration herein.

Besides, the conductive member 4 may not be in contact with the energy storage part 11 but simply in contact with the conductive part 12, so that the influence on the energy storage part 11 can be reduced in the process of forming the conductive member 4. For example, in the embodiments shown in FIGS. 2 to 9, the integrally penetrating conductive member 4 may not be in contact with the magnetic core 21 but only in contact with the winding 22, so that the influence on the property of the magnetic material can be reduced in the process of forming the integral conductive member 4. For example, the inductor 2 can be embedded in the insulating package material, that is, the main insulator 51. Between the unibody conductive member 4 and the magnetic core 21 is the insulating package body, that is, the main insulator 51, as shown in FIG. 9a.

By connecting the conductive part 12 in the passive element 1 to the conductive layer 52 in the substrate 5 using the unibody conductive member 4, it is advantageous in simplifying the structure of the passive element 1. Omissions of a leadout pin from the passive element 1 and arrangement of a pad on the substrate 5 for electrical connection also significantly reduce tolerance for assembling the passive element 1 with the substrate 5, thereby enabling a structurally compact power supply module at a reduced cost. Additionally, stacking the passive element 1 with the substrate 5 may allow for a further compact structure of the power supply module, improving the space utilization rate for the power supply module, while enhancing the external appearance of the power supply module with tidiness, simplicity and aesthetics.

In this embodiment, the passive element 1 will be illustrated as an inductor 2 when describing the structure of the power supply module by way of example. A magnetic core 21 of the inductor 2 forms the energy storage part 11, while a winding 22 of the inductor 2 forms the conductive part 12.

Figure 2:
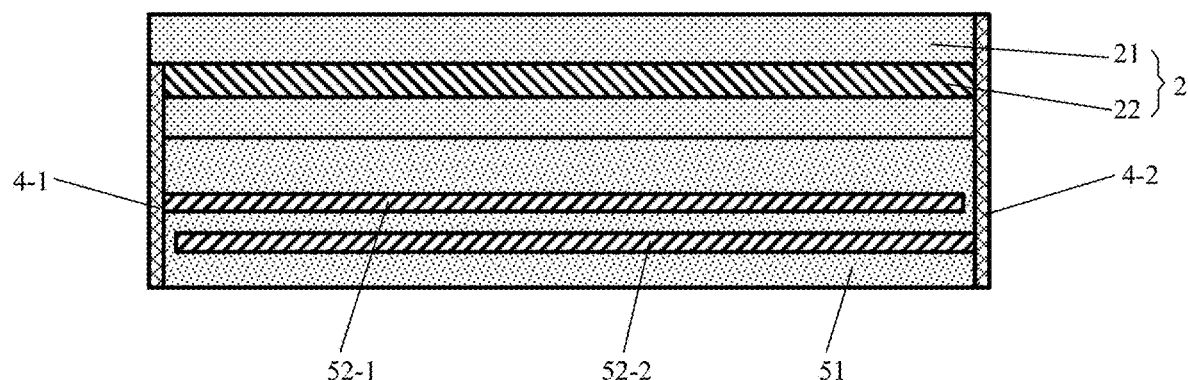
FIG. 2 is a sectional view of a second power supply module according to an embodiment of the present disclosure.

As depicted in FIG. 2, the conductive layer 52 may be located below the magnetic core 21. Thus, the unibody conductive member 4 may pass upwards through a plane in which a lower surface of the magnetic core 21 in the inductor 2 resides. The conductive member 4 is electrically connected at one end to the winding 22 and at the other end to the conductive layer 52. An example is taken where the conductive member 4 includes a first conductive member, e.g., the conductive member 4-1 in FIG. 2, and a second conductive member, e.g., the conductive member 4-2 in FIG. 2, which are oppositely arranged, and the conductive layer 52 includes: a first conductive layer, e.g., the conductive layer 52-1 in FIG. 2, and a second conductive layer, e.g., the conductive layer 52-2 in FIG. 2, the conductive layer 52-1 may be in contact with the conductive member 4-1 while the conductive layer 52-2 may be in contact with the conductive member 4-2. The conductive layer 52-1 and the conductive layer 52-2 may be 0.7 electrically connected in the substrate 5 to other components (not shown in the drawing), connecting the inductor 2 into the circuit.

By connecting the conductive part 12 (e.g., the winding 22 of the inductor 2 in the drawing) in the passive element 1 (e.g., the inductor 2 in the drawing) to the conductive layer 52 in the substrate 5 using the unibody conductive member 4 of the present embodiment, an OUT pin may be omitted from the inductor 2, simplifying the structure of the inductor 2, enabling a structurally compact power supply module at a reduced cost. Additionally, stacking the inductor 2 with the substrate 5 may allow for a further compact structure of the power supply module, improving the space utilization rate for the power supply module, while enhancing the external appearance of the power supply module with tidiness, simplicity and aesthetics.

Additionally, the power supply module may be fabricated in a panel manner in order to improve manufacturing efficiency of the power supply module. Moreover, a package level process technology can offer high manufacture precision and good consistency, with various PCB process steps omitted, such as SMT and reflow soldering. Moreover, using panel manufacture process helps lowering the cost in fabricating the power supply module.

The unibody conductive member 4 may be made using various technologies, e.g., plating, electroplating, or physical vapor deposition (PVD), chemical vapor deposition, or coating (e.g., sputter technology) or a method for filling a conductive material (e.g., conductive silver adhesive). The unibody conductive member 4 has achieved contact with the conductive part 12 of the passive element 1 and the conductive layer 52 of the substrate 5. In a word, any unibody conductive means is acceptable as long as it enables electrical connection between the conductive part 12 in the passive element 1, i.e., the winding 22 of the inductor 2, and the conductive layer 52 in the substrate 5.

Figure 3:
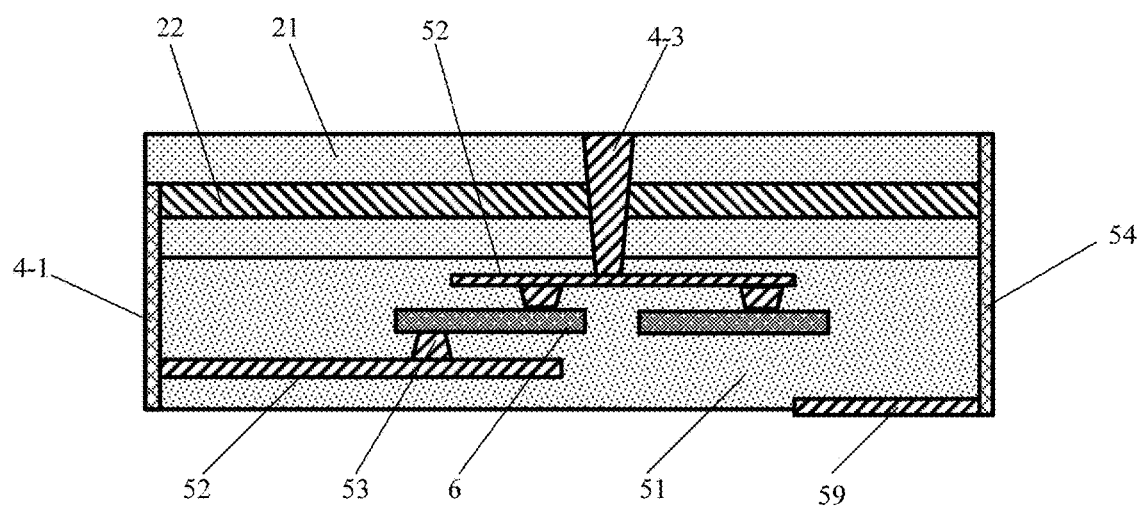
FIG. 3 is a sectional view of a third power supply module according to an embodiment of the present disclosure.

As depicted in FIG. 3, a chip 6 may be packaged within the substrate 5. The chip 6 is connected through a via 53 to a conductive layer 52, which is in turn electrically connected through a unibody conductive member 4 to a winding 22 of an inductor 2. The conductive member 4 may fully or partially penetrate through a magnetic core 21.

Illustratively, as depicted in FIG. 3, a unibody conductive member 4-1 merely penetrates upwards through the magnetic beneath the winding 22 but not the magnetic above the winding 22. At this time, part of a lateral side on the left of the power supply module may be provided with the unibody conductive member 4-1. Alternatively, a unibody conductive member 4-3 may also be used within the inductor 2 to penetrate through the inductor 2 and part of the insulating material of the substrate 5, i.e., part of the main insulator 51. That is, it penetrates downwards through the inductor 2 and part of the insulating material of the substrate 5, i.e., part of the main insulator 51. At this time, part of an upper surface of the power supply module may be provided with a unibody conductive member 4-3 to electrically connect the winding 22 of the inductor 2 to the conductive layer 52 of the substrate 5.

It is understandable that the power supply module may include any one or a combination of the conductive member 4-1 and conductive member 4-3.

The chip 6 may be packaged in the substrate 5 using various packaging technologies, such as leadframe based embedded packaging technology, or packaging technologies using a PCB-like insulating material as the frame, or other chip fan out packaging technologies. The power supply module also includes a conductive pad 59 for inputting or outputting an electric current. The conductive pad 59 is electrically connected, via a conductive connecting member 54 made from a conductive material, to the conductive layer 52, where the conductive pad 59, which is electrically connected to the conductive connecting member 54, may be exposed at the bottom of the substrate 5, and may serve as an OUT pin for the entire power supply module.

Figure 4A:
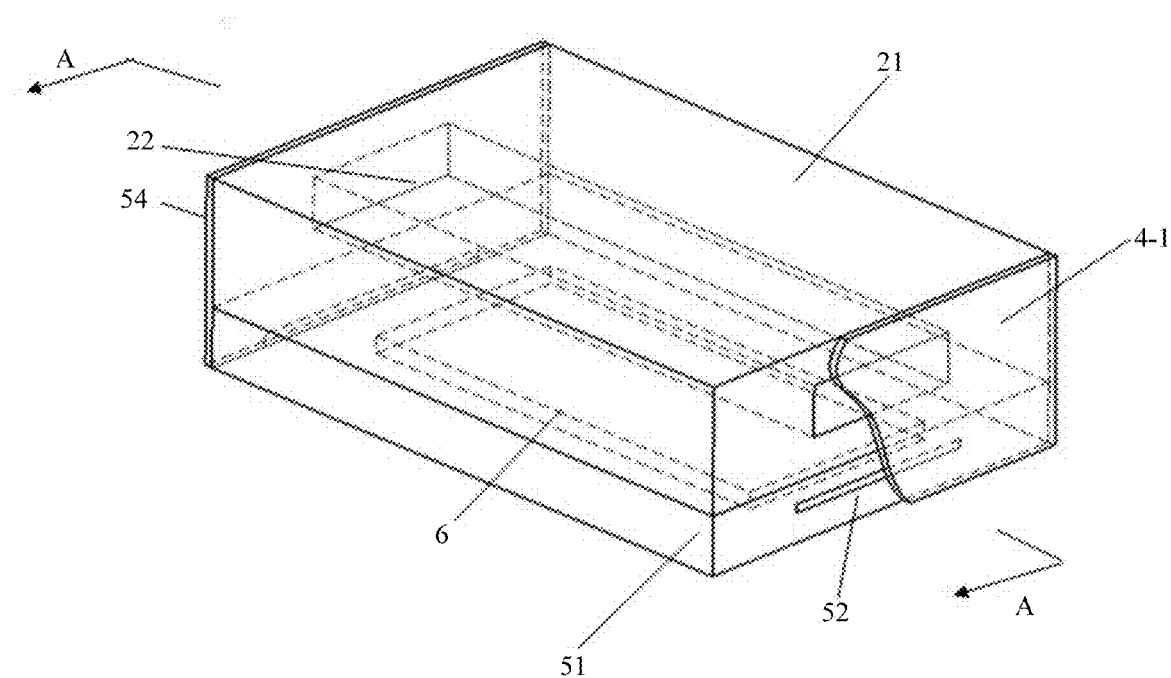
FIG. 4a is a perspective view of a single-phase inductor based power supply module according to an embodiment of the present disclosure.
Figure 4B:
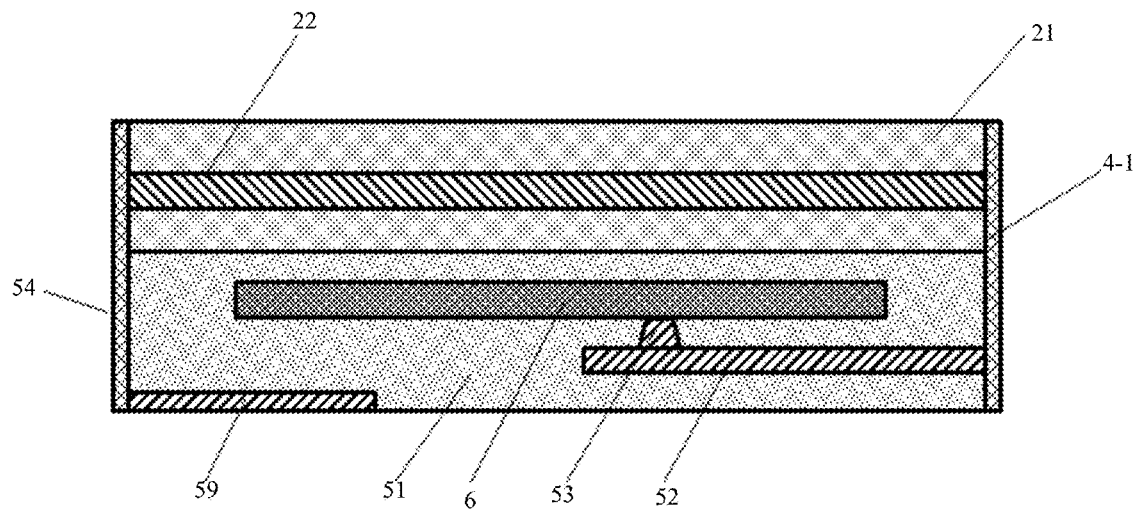

FIGS. 4a-4b illustrate schematic perspective views of a power supply module based on a single-phase inductor. In the drawings, the inductor 2 is stacked with the substrate 5. The inductor 2 may be stacked on the surface of the substrate 5, that is, the inductor 2 may be provided externally to the substrate 5. The winding 22 of the inductor 2 may be exposed at an end, at which the conductive layer 52 of the substrate 5 may also be exposed. A unibody conductive member 4 electrically connects the winding 22 of the inductor 2 to the conductive layer 52 in the substrate 5. Additionally, the drawings illustrate the unibody conductive member 4 (as indicated by the 4-1 in the drawings) is a planar sheet. For instance, the unibody conductive member 4 may be formed in its entirety by applying electroplating to the exposed end parts of the winding 22 and the conductive layer 52. Of course, the unibody conductive member 4 may also be formed from a metallization layer produced by physical or chemical vapor deposition.

Further, the packaging chip 6 may be embedded in the substrate 5. If the chip 6 has a half-bridge circuit, the conductive layer 52 depicted in the right sides of the drawings is electrically connected to the unibody conductive member 4-1, the conductive layer 52 and the conductive via 53 are electrically connected to the chip 6. For instance, the conductive layer 52 depicted in the right sides of the drawings may be connected to the SW electrode of the chip 6. Meanwhile, the conductive connecting member 54 depicted in the left sides of the drawings may be connected at the left side to the substrate 5 and the conductive pad 59 on the bottom of the substrate 5 to form an OUT pin of the overall power supply module, with the details shown in FIG. 4b. Thus, the power supply module as depicted in FIG. 4a is equivalent to a single-phase DCDC power regulation module. The conductive pad 59 is exposed on the surface of the substrate 5 or the surface of the passive element 1.

The power supply module in this embodiment is structurally compact, visually neat and pleasurable, with high power density, and simple manufacture process at low cost. Additionally, the magnetic core 21 may cooperate tightly with the insulated packing material, leaving no gap while capable of enhancing the effectiveness in heat dissipation for the power supply module.

In some embodiments, the conductive member may be in contact with the conductive part in the passive element and the conductive layer in the substrate. While achieving the electrical connection between the conductive part in the passive element and the conductive layer, the conductive member may further be lead out to the surface of the substrate 5 to form a pad. Illustration is made by taking FIGS. 4b and 3 as an example, with the conductive member 4-1 being lead out to the lower end part of the surface of the substrate 5, a pad that offers electrical connection to the external may be formed. That is, the conductive member 4-1 may extend along a lateral side of the substrate 5 downwards until the lower surface of the substrate 5. The part of the conductive member 4-1 which extends to the lower surface of the substrate 5 forms the pad for electrically connecting to external electrical elements.

Figure 5:
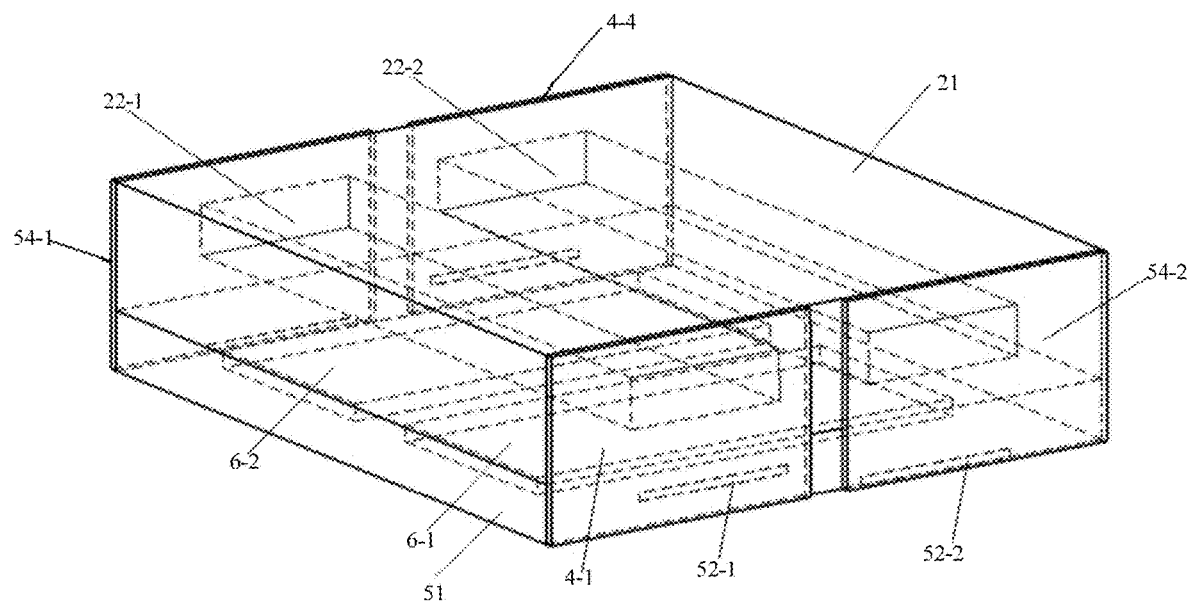
FIG. 5 is a perspective view of a multi-phase inductor based power supply module according to an embodiment of the present disclosure.

Comparing the power supply module depicted in FIG. 5 with the one in FIGS. 4a-4b, the distinction lies primarily in the use of a multi-phase inductor and the integration of multiple chips 6. For instance, a two-phase inductor is illustrated by way of example, the depicted inductor 2 includes a magnetic core 21, a winding 22-1 and a winding 22-2. The substrate 5 includes an insulated packing material and multiple conductive layers 52. Moreover, two chips 6, i.e., the chips 6-1 and 6-2 in FIG. 5, are packaged within the substrate 5. Assuming that when the conductive layer 52-1 is connected to the SW terminal of the chip 6-1 (referring to FIG. 14a), the conductive layer 52-1 is electrically connected via the unibody conductive member 4-1 to the winding 22-1 of the inductor 2, while another end of the winding 22-1 is connected via an electrical connection with the unibody conductive connecting member 54-1 to the conductive layer 52 on the bottom of the substrate 5 to allow for realizing the electrical pin for the overall power supply module. The remaining winding 22-2 of the inductor 2 may be connected via the unibody conductive member 4-4 to the conductive layer 52 in the substrate 5 as well as to the SW terminal of the other chip 6-2 (referring to FIG. 14a). Another end of the winding 22-2 is electrically connected via the unibody conductive connecting member 54-2 to the conductive layer 52-2 on the substrate 5. Similarly, the conductive layer 52-2 may directly form the output electrical pin for the power supply module. The unibody conductive member 4 on the same side is electrically insulated from the conductive layer 52.

In this embodiment, the multi-phase inductor and multiple chips 6 are integrated, and unibody conductive members 4 with various electrical characteristics are formed on the end face, allowing for realization of a power supply module with improved power or current output capacity. With the integrated design, power density can be further improved for the power supply module.

A lateral side of a power supply module is provided with at least one first groove connected a conductive part 22 and a conductive layer 52, with a conductive member 4 being provided within the first groove. A winding 22 of an inductor 2 and the conductive layer 52 in a substrate 5 may be exposed via the first groove, so that the conductive member 4 provided within the first groove may electrically connect the winding 22 of the inductor 2 to the conductive layer 52 in the substrate 5. The first groove may be shaped as a first rectangle groove, an arc, etc., as long as the conductive member 4 provided therein can electrically connect the winding 22 of the inductor 2 to the conductive layer 52 in the substrate 5.

Figure 6:
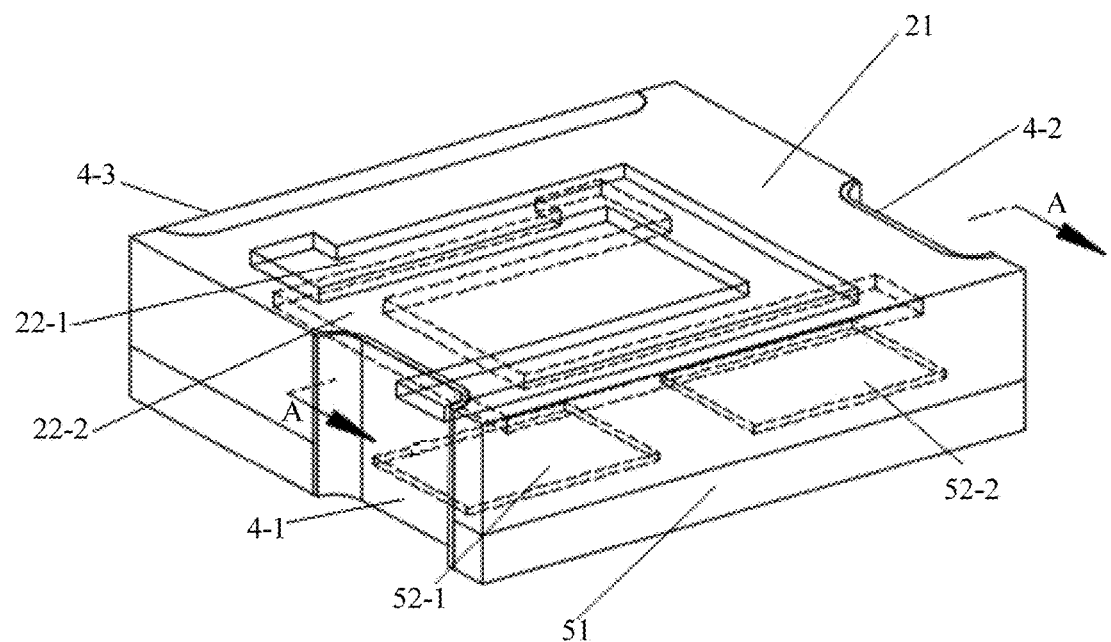
FIG. 6 is a schematic structural view of a fifth power supply module according to an embodiment of the present disclosure.
Figure 7:
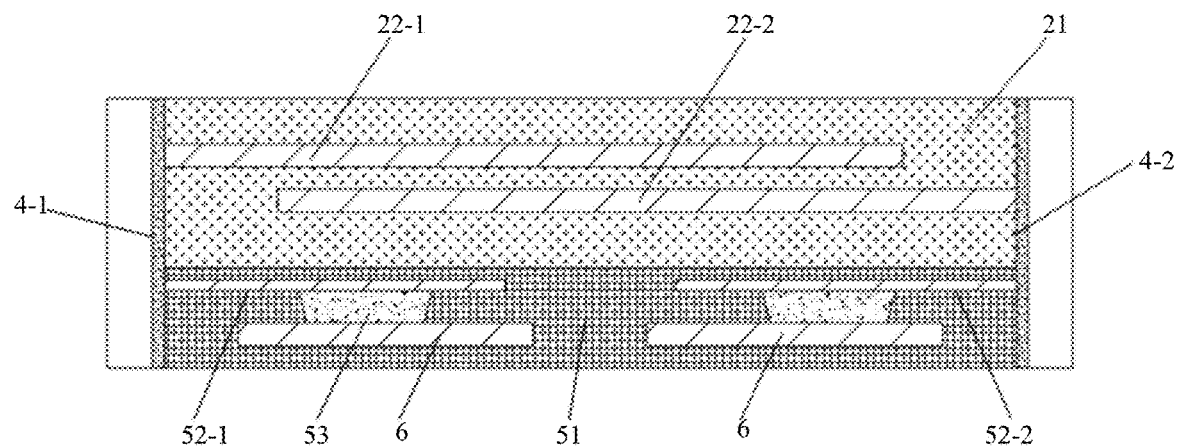
FIG. 7 is a sectional view taken along A-A in FIG. 6.

FIG. 6 illustrates the structure of another unibody conductive member 4. FIG. 7 is a sectional view taken along A-A in FIG. 6. Illustratively, the unibody conductive members 4-1 and 4-2 may adopt a half slotted hole as their structural forms. The unibody conductive member 4-3 also uses a half slotted hole as its structure, except that a conductive material covers the surface, or fills up the structure, of the half slotted hole. A lateral side of the power supply module is provided with another half slotted hole that is structurally adapted to the above half slotted hole, said another half slotted hole forming a first groove.

FIG. 6 also illustrates windings 22-1 and 22-2 as "U" shapes, where the winding 22-1 is connected at one end to the unibody conductive member 4-3 and connected at the other end to the unibody conductive member 4-1, and the winding 22-2 is connected at one end to the unibody conductive member 4-3 and connected at the other end to the unibody conductive member 4-2. If the unibody conductive member 4-3 serves as a common output terminal for both windings 22, then the two windings 22 in FIG. 6 may be combined with the magnetic core 21 to form a coupled inductor, as referring to the circuit depicted in FIG. 14a. In FIG. 7, the unibody conductive member 4-1 is electrically connected to the conductive layer 52-1, which in turn is connected through the via 53 to a chip 6. Similarly, the unibody conductive member 4-2 is also connected through the conductive layer 52-2 and the via 53 to another chip 6. Of course, a circuit in practically application does not have to be limited to the one depicted in FIG. 14a, and the shape of the winding 22 may be flexibly adjusted as practically needed.

Of course, the unibody conductive member 4 is not limited to the foregoing structures. Rather, its structure may be adapted to the shape of the first groove. Illustratively, the unibody conductive member 4 may fill up the first groove. Alternatively, the unibody conductive member 4 may merely cover the inner wall of the first groove, and can electrically connect the winding 22 of the inductor 2 to the conductive layer 52 in the substrate 5. The first groove may be shaped as a first rectangle groove, a first arc groove, etc., as long as the conductive member 4 provided therein can electrically connect the winding 22 of the inductor 2 to the conductive layer 52 in the substrate 5.

A first groove on a lateral side of a power supply module includes a plurality of arc first grooves, forming "stamp holes" on the lateral side of the power supply module. At least some of a plurality of arc grooves are provided intermittently. Alternatively, at least some of the plurality of arc grooves are provided continuously. The unibody conductive member 4 may fill up the arc groove. Alternatively, the unibody conductive member 4 may merely cover the inner wall of the arc groove.

Figure 8A:
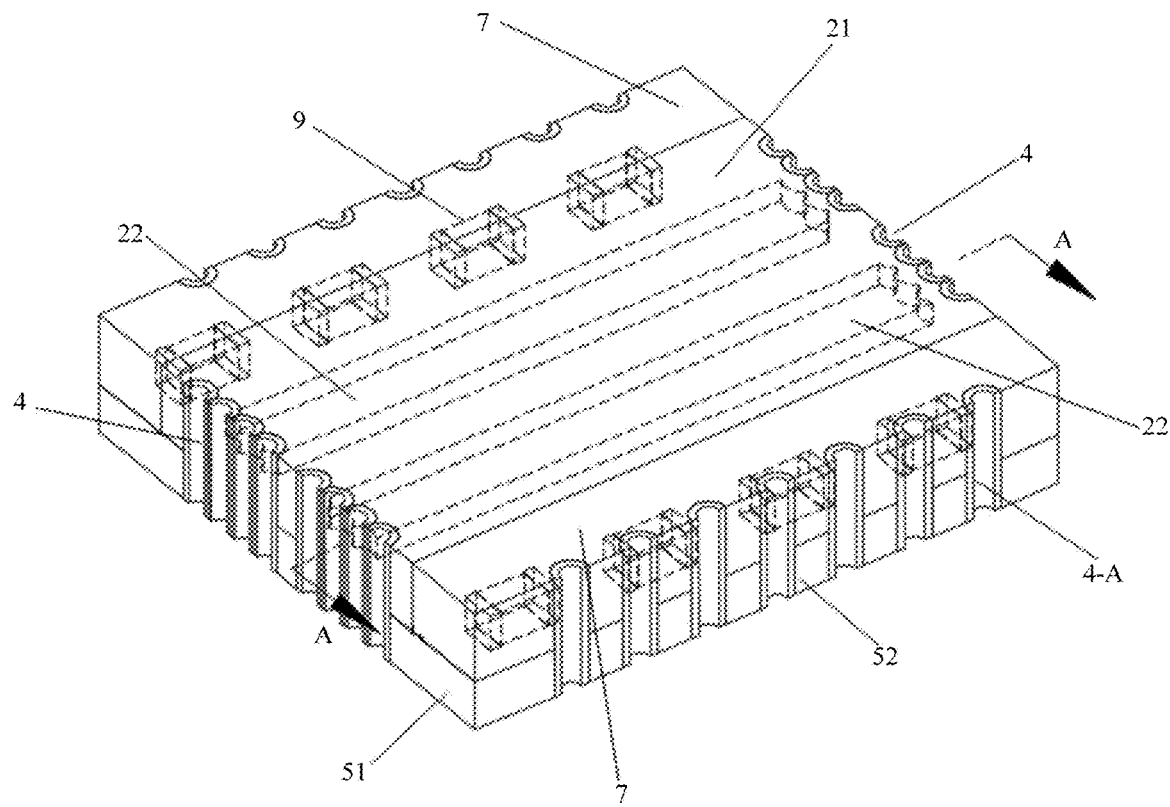
FIG. 8a is a schematic structural view of a fifth power supply module according to an embodiment of the present disclosure.
Figure 8B:
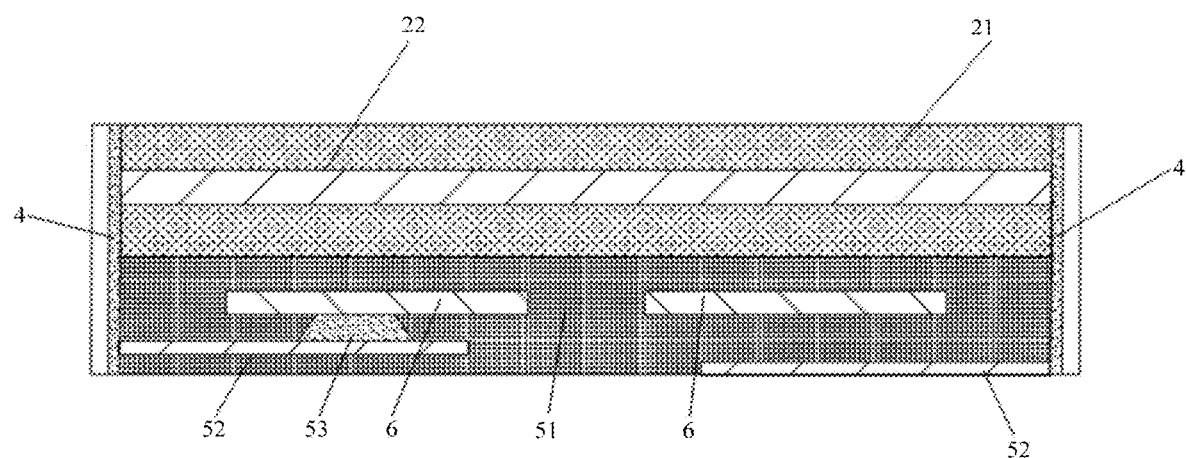
Figure 9A:
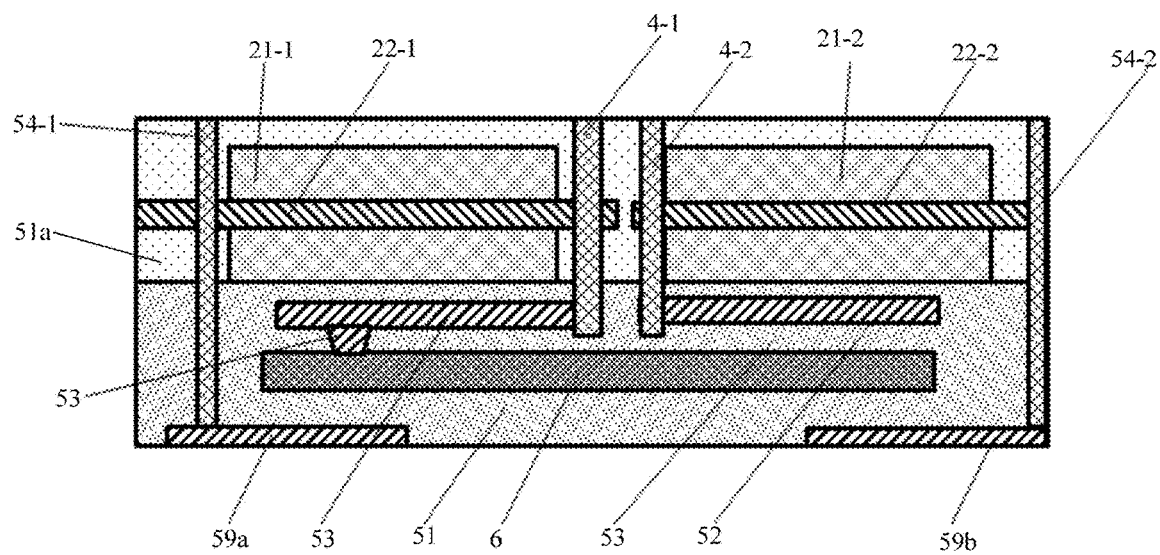
FIGS. 9a and 9b are schematic structural views of a fifth power supply module according to an embodiment of the present disclosure.

FIGS. 8a-8b illustrate forming the unibody conductive member 4 from the "stamp holes". FIG. 8b is a sectional view taken along A-A in FIG. 8a. The unibody conductive member 4 formed from the "stamp holes" in the drawing electrically connects the winding 22 of the inductor 2 to the conductive layer 52 in the substrate 5. The conductive layer 52 is electrically connected through the via 53 to the chip 6. Additionally, the unibody conductive member 4-A is fabricated using the same process as that for the unibody conductive member 4, facilitating the conductive layer 52 in the substrate 5 electrical connecting with pin of the module. That is, the structure and method that is advantageous for the unibody conductive member 4 of the present disclosure may also help the module to form its output pin, thereby further simplifying the structure of the module, bringing more consistency and simplicity into its manufacture process at a reduced cost. Additionally, if the substrate 5 has a larger size than the inductor 2, other electrical components 9, e.g., the capacitor as shown in FIG. 8a, may be provided besides the inductor 2. In the region of the capacitor, a packaging layer 7 may also be formed using an insulated packing material to improve the robustness of the module. Further, the unibody conductive member 4-A may also be formed on the basis of a magnetic insulated packing material to help forming an OUT pin for the module. Of course, the unibody conductive member 4-A may alternatively be formed on the magnetic core 21.

The unibody conductive member 4 formed from the "stamp holes" in the FIGS. 8a-8b brings in added advantage in the manufacture. Moreover, because of the added surface area from the plurality of "stamp holes" connecting the winding 22 and the conductive layer 52, the unibody conductive member 4 may have an expanded conductive path, which is advantageous in decreasing the resistance for the electrical connection between the winding 22 and the conductive layer 52. Of course, the unibody conductive member 4 may also be formed into a waveform to still improve the conductivity and decrease the resistance.

Figure 9B:
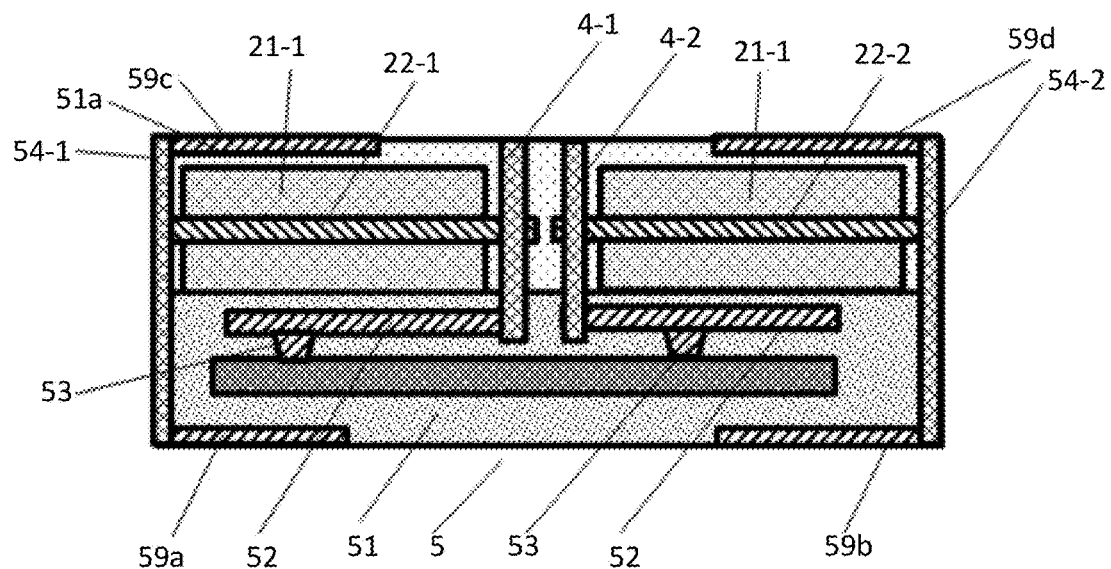

As shown in FIGS. 9a and 9b, the aforementioned inductor 2 may also be embedded into the substrate 5, be stacked with the conductive layer 52 in the substrate 5, and be connected through the unibody conductive member 4 to the conductive part 12 (i.e., the winding 22) of the inductor 2 and the conductive layer 52.

As illustrated in FIG. 9a, two inductors 2 are embedded in a main package 51a formed from the insulated packing material, where one of the inductors 2 includes a magnetic core 21-1 and a winding 22-1, and the other one of the inductors 2 includes a magnetic core 21-2 and a winding 22-2. The winding 22-1 is electrically connected through the unibody conductive member 4-1 to the conductive layer 52, while the winding 22-2 is electrically connected through the unibody conductive member 4-2 to another conductive layer 52. The conductive pad 59 is exposed on the surface of the substrate 5. The winding 22-1 is electrically connected through the conductive connecting member 54-1 to the conductive pad 59a, allowing for the formation of an output pad. The winding 22-2 is electrically connected through another conductive connecting member 54-2 to the conductive pad 59b, allowing for the formation of an output pad. Of course, more inductors 2 may be embedded as needed, which may be electrically connected through the unibody conductive member 4 to the conductive layer 52 in the substrate 5.

Besides, in some examples, as in FIG. 9a, the conductive pad 59 is provided on the lower surface of the power supply module. In other examples, the conductive pad 59 may also be provided on the upper surface of the power supply module, i.e., the surface of the power supply module on the side of the passive element 1. In still other examples, as shown in FIG. 9b, conductive pads 59 may be simultaneously provided on the upper and lower surfaces of the power supply module to form a power supply module of the double-sided output terminal (i.e., the conductive pads 59).

Figure 10A:
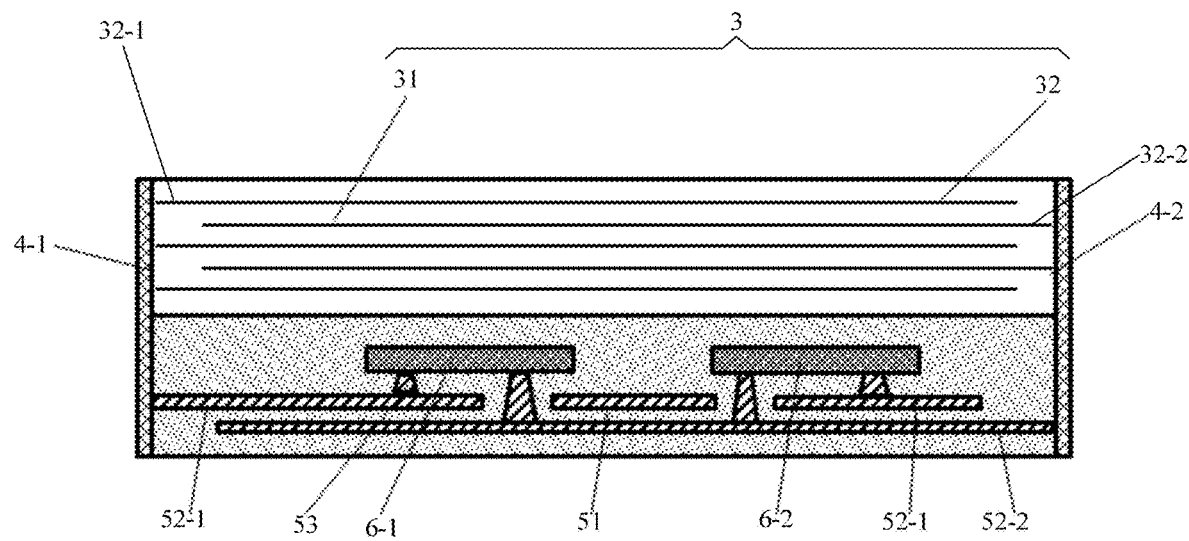
FIG. 10a is a schematic structural view of a sixth power supply module according to an embodiment of the present disclosure.

FIG. 10a illustrates that the passive element 1 may also include a capacitor 3. The capacitor 3 includes a dielectric part 31 and a conductive part 32, and is stacked with the conductive layer 52 in the substrate 5. The dielectric part 31 functions as an energy storage part for the capacitor 3. Illustratively, the conductive part 32 includes a first plate electrode 32-1 and a second plate electrode 32-2, which are oppositely arranged. The dielectric part 31 is arranged between the first plate electrode 32-1 and the second plate electrode 32-2, together forming the capacitor 3. The conductive layer 52 includes a first conductive layer (e.g., the depicted 52-1) and a second conductive layer (e.g., the depicted 52-2). The conductive member 4 includes a first conductive member (e.g., the depicted 4-1) and a second conductive member (e.g., the depicted 4-2), where the conductive member 4-1 penetrates through the dielectric part 31 to come into contact with the first plate electrode 32-1 and the conductive layer 52-1, separately. The conductive member 4-2 is in contact with the second plate electrode 32-2 and the conductive layer 52-2. That is, the unibody conductive member 4-1 as shown in FIG. 10a connects the conductive part 32 of a pole of the capacitor 3 to the conductive layer 52-1, and the unibody conductive member 4-2 connects the conductive part 32 of another pole of the capacitor 3 to the conductive layer 52-2. The conductive layers 52-1 and 52-2 may be connected to corresponding poles of the chip 6, respectively. For instance, if the capacitor 3 is an input capacitor 3 of the chip 6, then the conductive layers 52-1 and 52-2 are connected to poles Vin and GND of the chip 6, respectively.

Figure 10B:
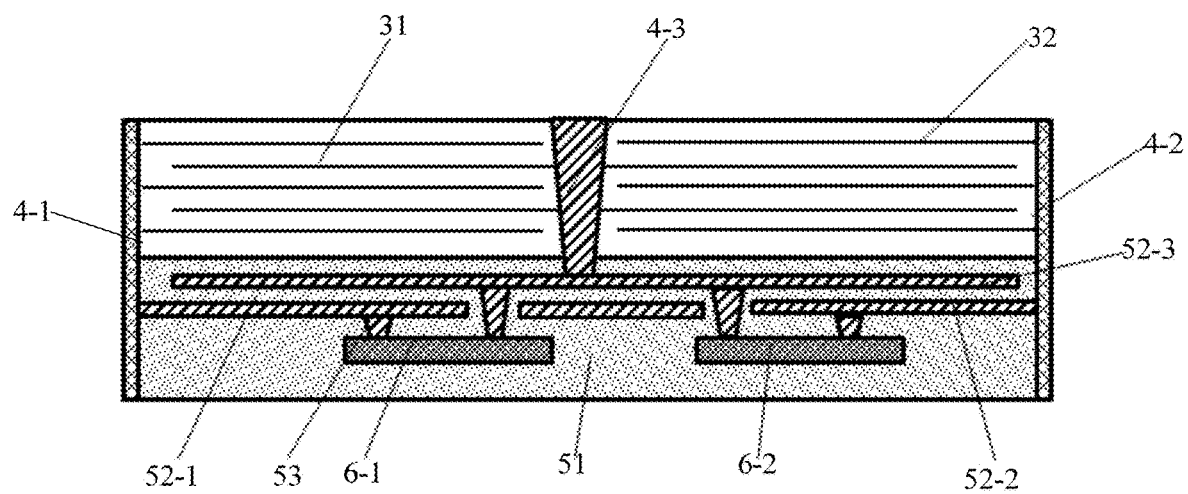
FIG. 10b is a schematic structural view of a seventh power supply module according to an embodiment of the present disclosure.

As shown in FIG. 10b, the capacitor 3 may further be internally provided with a unibody conductive member 4-3 to electrically connect the conductive part 32 of one pole of the capacitor 3 to the conductive layer 52-3. The unibody conductive members 4-1 and 4-2 are both electrically connected to the conductive part 32 of another pole of the capacitor 3, while the unibody conductive member 4-1 is electrically connected to the conductive layer 52-1 and the unibody conductive member 4-2 is electrically connected to the conductive layer 52-2, then, the conductive layer 52-1 may be connected to the conductive layer 52-2. If the capacitor 3 is the input capacitor, then the conductive layers 52-3 and 52-1 (or 52-2) may be electrically connected to the input positive pole (Vin) and input negative pole (GND) of the chip 6 respectively. That is, the capacitor 3 has formed two capacitors connected in parallel, which is advantageous in improving the operating frequency or other features of the system, e.g., reducing the equivalent impedance. Of course, the poles of the capacitor 3 may be lead-out at various locations to form various network topologies for the capacitor 3.

Similarly, the unibody conductive member 4 may also be used in various forms similar to those described above to connect the conductive part 32 of the capacitor 3 to the conductive layer 52 in the substrate 5. For instance, the unibody conductive member 4 may adopt the form of electroplating on the entire end face, or a partition on the end face, or a long slotted hole, or a half slotted hole (shaped similarly to the unibody conductive member 4-1 as shown in FIG. 6), or stamped holes, or waveform surfaces. The unibody conductive member 4 may be formed using electroplating, physical deposition, chemical deposition, or other respective metallization methods, or with a conductive material filled, etc.

Figure 11:
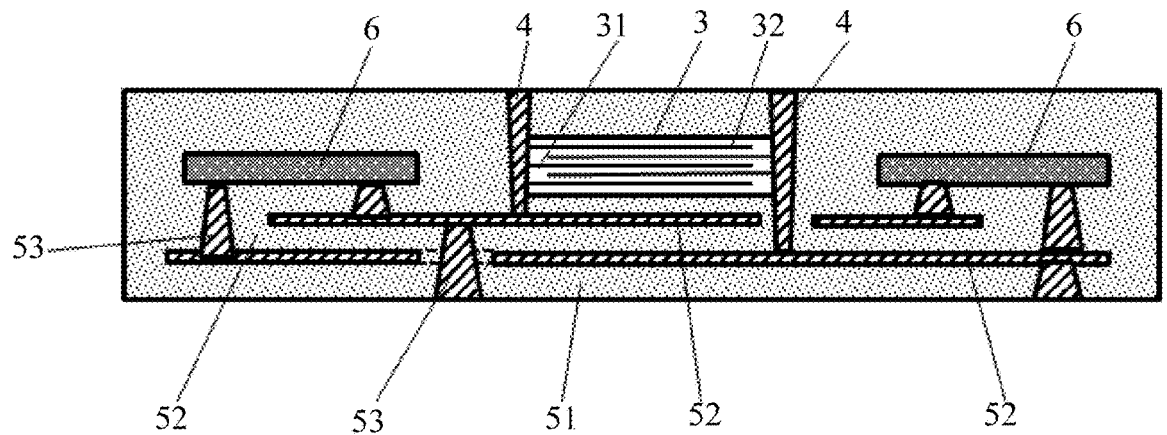
FIG. 11 is a schematic structural view of an eighth power supply module according to an embodiment of the present disclosure.

FIG. 11 illustrates a capacitor 3 being embedded into an insulating material of a substrate 5, and the pole being electrically connected through a unibody conductive member 4 to a conductive layer 52. The conductive layer 52 is electrically connected to a corresponding terminal of a chip 6. For instance, presuming the capacitor 3 is an input capacitor 3 for the chip 6, then the capacitor 3 may be provided between the two chips 6 and be directly connected through the unibody conductive member 4 to the conductive layer 52, which is in turn electrically connected to the input terminal and GND terminal of the chip 6. Since the connection loop between the capacitor 3 and the chip 6 is a small one, the parasitic inductor 2 of the loop is small, providing desirable current equalization and filter effects with a simple and compact structure that can be fabricated using a simple process.

Various advantages can be introduced by using the unibody conductive member 4 to connect the conductive part 32 of the capacitor 3 and the conductive layer 52 in the substrate 5. For instance, the capacitor 3 does not have to provide an electrode terminal, which helps shrinking the size of the capacitor 3 or improving the capacitance at an equal packaging size. Moreover, the structure is simple, the lead-out pin can be omitted, so is the process for fabricating the same, which are advantageous in reducing the cost. Additionally, since the conductive part 32 is connected through the unibody conductive member 4 to the conductive layer 52, the connecting path is shortened, which reduces the transmission impedance, and is advantageous in improving system efficiency and dynamic performance. With the structure and process of the present disclosure, process steps such as SMT and reflow soldering may be omitted, removing the reserved structures and spaces required for the corresponding process clearance and process tolerance, further compacting the structure of the power supply module while increasing the power density. Using the unibody conductive member 4 also enables offering the output terminal for the power supply module while connecting the conductive part 32 of the energy storage part 11 and the conductive layer 52 of the substrate 5, providing flexibility in application.

Figure 12:
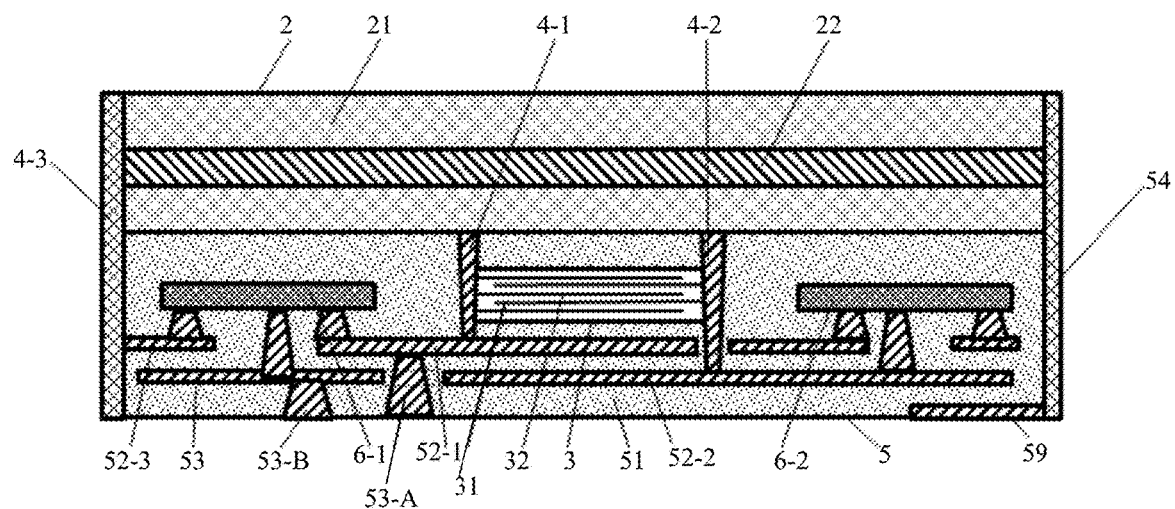
FIG. 12 is a schematic structural view of a ninth power supply module according to an embodiment of the present disclosure.

FIG. 12 illustrates an embodiment in which an inductor 2, a capacitor 3 and a substrate 5 are integrated to form a completed power supply module. Reference is again made to the circuit diagram illustrated in FIG. 14a. Assuming that the chip 6 includes a half-bridge circuit formed by two switches, while FIG. 12 includes a circuit formed by two chips 6 (e.g., the depicted 6-1 and 6-2). The inductor 2 is stacked on the substrate 5, the capacitor 3 is embedded in the insulated packing material of the substrate 5, all being stacked with the conductive layer 52 in the substrate 5. Assuming the depicted capacitor 3 is an input capacitor, and the inductor 2 is the output inductor of the chip 6-1. In some embodiments, the output inductor of the chip 6-2 is not depicted in the drawing, similar to the inductor 2, another inductor 2 can be located perpendicular to the drawing (or perpendicular to the screen) along with the inductor 2, as can be seen, but not limited to, the FIG. 5.

As depicted in FIG. 12, the unibody conductive member 4-1, i.e., the first conductive member, is electrically connected to a pole of the capacitor 3, and the unibody conductive member 4-2, i.e., the second conductive member, is electrically connected to another pole of the capacitor 3. The unibody conductive member 4-1 is electrically connected to the conductive layer 52-1, i.e., the first conductive layer, and the unibody conductive member 4-2 is electrically connected to the conductive layer 52-2, i.e., the second conductive layer. The conductive layer 52-1 and conductive layer 52-2 may be connected to the input terminal (pin) and GND terminal (pin) of the chip 6. Assuming the conductive layer 52-3, i.e., the third conductive layer, is connected to the SW pole of the chip 6-1 (referring to FIG. 14a), and the conductive layer 52-3 is connected through the unibody conductive member 4-3, i.e., the third conductive member, to the winding 22 of the inductor 2. Additionally, the winding 22 is connected at the other end through the conductive connecting member 54 to the conductive pad 59. The conductive pad 59 may serve as the output terminal Vo for the power supply module. The vias 53-A and 53-B are connected to the conductive layers 52-1 and 52-2, respectively, forming output terminals Vin and GND. The power supply module has a low circuitry loop impedance and effective current equalization among multi-phases. Thanks to the tight fit among various components as well as the vertical thermal pathway formed from the unibody conductive member 4, good heat dissipation is offered. Moreover, the simple and compact structure helps reducing the manufacture cost and product consistency.

The present embodiment further provides a power supply module, including: a substrate, a power component, a power-type passive element and a unibody conductive connecting member, where a conductive layer is formed in the substrate; the power component and the passive element are provided in a stacking manner; the passive element and the conductive layer are provided in a stacking manner, and a part of the passive element is covered by a first insulating layer; the passive element includes a conductive part and an energy storage part; the conductive connecting member is on an outer side of the power supply module, and is electrically connected to a conductive pad on an upper surface of the power supply module or/and a conductive pad on a lower surface of the power supply module; the conductive connecting member penetrates through a plane where a surface of the energy storage part facing the conductive layer is located, and the conductive connecting member is in contact with one of the conductive layer and the conductive part, respectively. The power-type passive element refers to a passive element involved in power conversion, such as an output inductor of a buck circuit, a transformer in an LLC circuit, or an input/output capacitor and the like, so as to distinguish it from a passive element used for signal conversion.

Where the power component may include a chip; the passive component may include an inductor. The structure of the present embodiment will be exemplified below by taking this as an example. In addition, it can be understood that the part relating to the power supply module that is not described in the present embodiment may be the same as or similar to the foregoing embodiments, and details are not described herein again.

Figure 15:
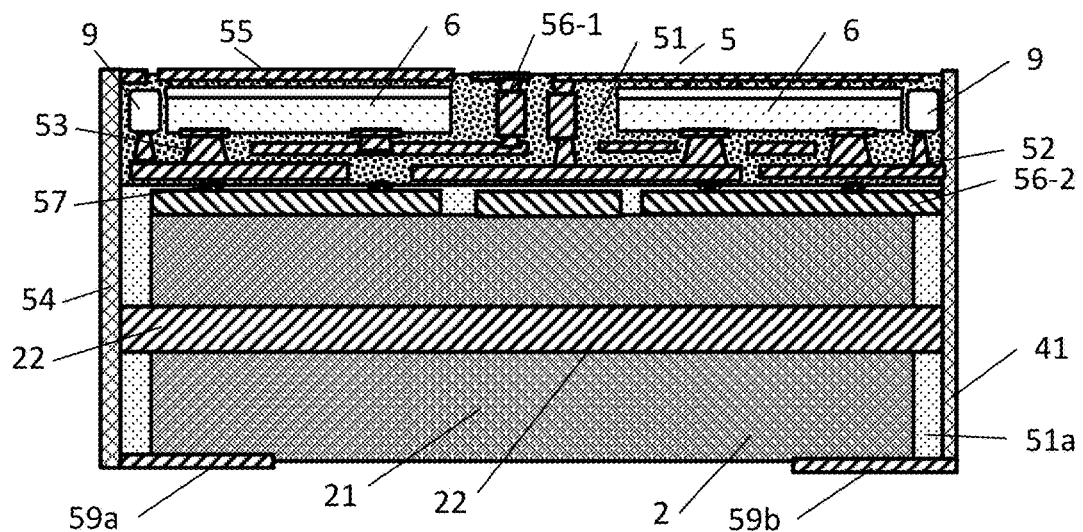
FIG. 15 is a schematic structural view of a first power supply module according to another embodiment of the present disclosure.

As shown in FIG. 15, the chip 6 is embedded in the main insulator 51 of the substrate 5, electrically connected to the inductor 2 through the conductive layer 52 through the conductive member 41 or 42, and the chip 6 and the inductor 2 are provided in a stacking manner, and the inductor 2 is provided below the chip 6. The pad 59*a* or 59*b* may be provided on the side of the inductor 2 for external electrical connection of the power supply module; by providing the inductor 2 below the chip 6, the heat dissipation of the power supply module is also facilitated. The magnetic core 21 of the inductor 2 is embedded in the first insulating layer 51*a*, and the conductive member 41 or 42 penetrates through the surface between the substrate 5 and the magnetic core 21 of the inductor 2 to electrically connect the conductive layer 52 to the winding 22 of the inductor 2. Insulated packing materials are filled between the conductive member 41 or 42 and the magnetic core 21 to form the first insulating layer 51*a*, so as to reduce the influence on the magnetic core 21 in the production process of the conductive member 41 or 42.

An exposed conductive layer 55 may be provided above the chips 6. For example, the exposed conductive layer 55 may be electrically connected to the GND of the power supply module, and a copper block or leadframe 56-1 may be provided between the chips 6 to form upper and lower conductive paths. The exposed conductive layer 55 and the conductive layer 52 below the chips 6 can be more conveniently connected. Further, if the upper surface of the chip 6 is the back surface of the chip without a pin, a metal layer can also be formed on the back surface of the chip 6. The upward thermal conductivity of the chip 6 can be enhanced by making the metal layer and the exposed conductive layer 55 in direct contact with each other or in contact with each other through vias. Other components 9, such as peripheral component capacitors or resistors of the chips 6, may also be embedded in the substrate 5. A leadframe 56-2 may also be provided between the substrate 5 and the inductor 2. The leadframe is beneficial for reducing current transmission or conduction loss, and is advantageous for enhancing the electrical conductivity between the chips 6 and the inductor 2.

Figure 16:
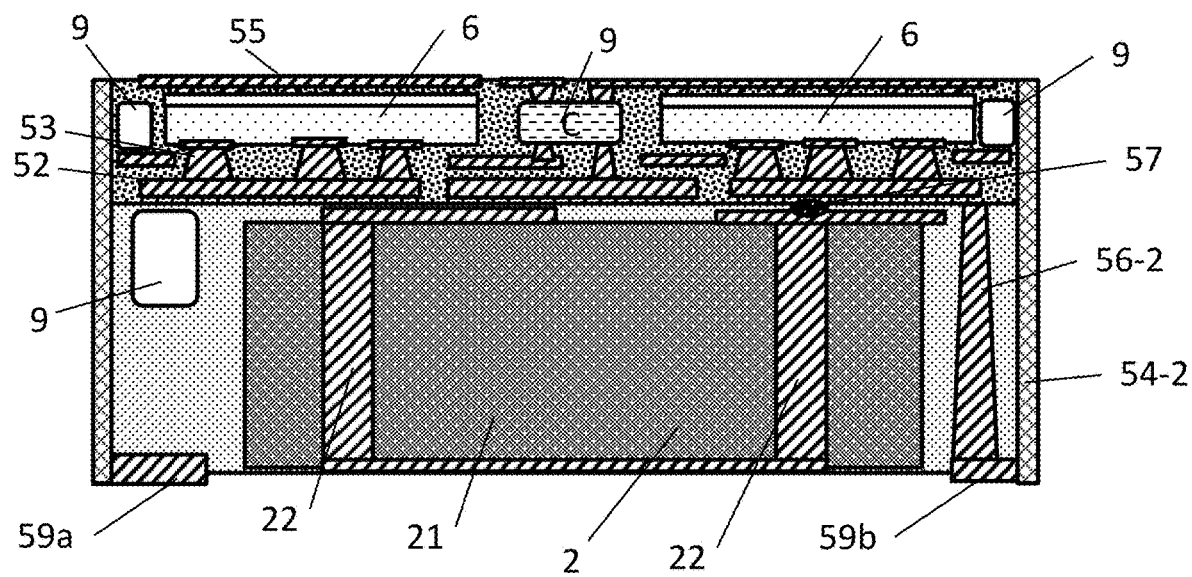
FIG. 16 is a schematic structural view of a second power supply module according to another embodiment of the present disclosure.

The difference between FIG. 16 and FIG. 15 mainly lies in that the winding 22 of the inductor is perpendicular to the substrate 5, thus facilitating heat dissipation downward, and the channel for lower heat dissipation is more direct and the transmission path is shorter. The inductor 2 can be electrically connected to the substrate 5 and the chips 6 through the solder joints 57, and the conductive pad (also referred to as a pad) 59*a* or 59*b* of the power supply module can be taken out by virtue of the conductive connecting member 54-1 or 54-2. The conductive connecting member 54-1 or 54-2 penetrates through the plane where the surface of the energy storage part 21 facing the conductive layer 52 is located, and the conductive connecting member 54-1 or 54-2 is electrically connected to the conductive member 22 and the conductive layer 52, respectively. The conductive connecting member 54-1 or 54-2 is on the outer side of the power supply module, and is electrically connected to the conductive pad 59 (such as the conductive pad 59*a* or 59*b*) on the lower surface. Of course, the conductive pad 59 may also be provided on the upper surface of the power supply module. The conductive connecting member 54-1 or 54-2 can also be electrically connected to the conductive pad 59 on the upper surface. A copper block 56-2 may also be provided in the first insulating layer 51*a* for facilitating the transmission of a large current. Other components 9, such as capacitors and the like, may also be provided in the first insulating layer 51*a*.

Figure 17:
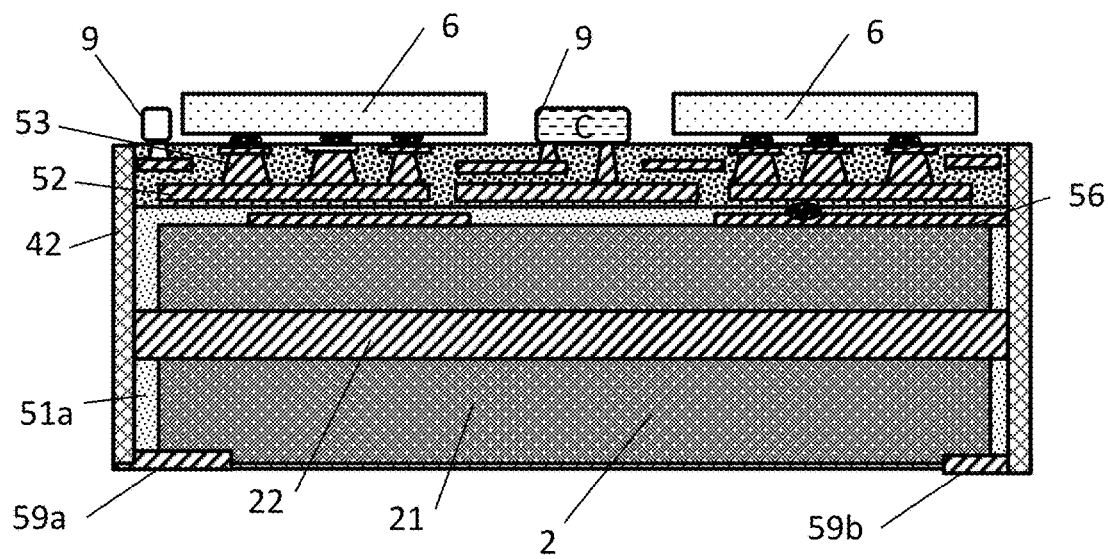
FIG. 17 is a schematic structural view of a third power supply module according to another embodiment of the present disclosure.

The main difference between FIG. 17 and FIG. 15 lies in that the chips 6 are not embedded in the substrate 5, but is attached to the surface of the substrate 5 in a surface-mount manner, and is electrically connected to the passive element, that is, the inductor 2, through the via 53 and the conductive layer 52. Other components 9, such as capacitors, or peripheral components of the chips 6, may also be provided between the chips 6.

Figure 18A:
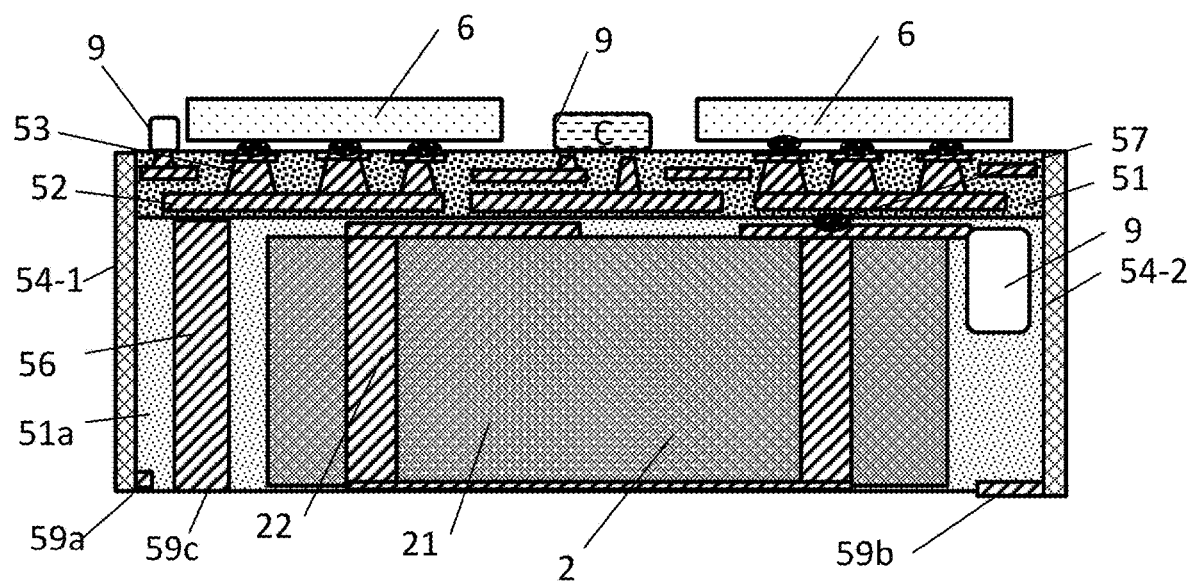
FIG. 18a to 18c are schematic structural views of a fourth power supply module according to another embodiment of the present disclosure.

The main difference between FIG. 18*a* and FIG. 17 lies in that the winding 22 of the inductor 2 is perpendicular to the substrate 5, the inductor 2 can be electrically connected to the substrate 5 and the chips 6 through the solder joints 57, and the conductive pad 59*a* or 59*b* of the power supply module can be taken out by virtue of the conductive connecting member 54-1 or 54-2. The conductive connecting member 54-1 or 54-2 penetrates through the plane where the surface of the energy storage part 21 facing the conductive layer 52 is located, and the conductive connecting member 54-1 or 54-2 is electrically connected to the conductive member 22 and the conductive layer 52, respectively. The conductive connecting member 54-1 or 54-2 is on the outer side of the power supply module, and is electrically connected to the conductive pad 59 on the lower surface. Of course, the conductive pad 59 may also be provided on the upper surface of the power supply module. The conductive connecting member 54-1 or 54-2 can also be electrically connected to the conductive pad 59 on the upper surface. A copper block 56-2 may also be provided in the first insulating layer 51*a* for facilitating the transmission of a large current. Other components 9, such as capacitors and the like, may also be provided in the first insulating layer 51a.

Figure 18B:
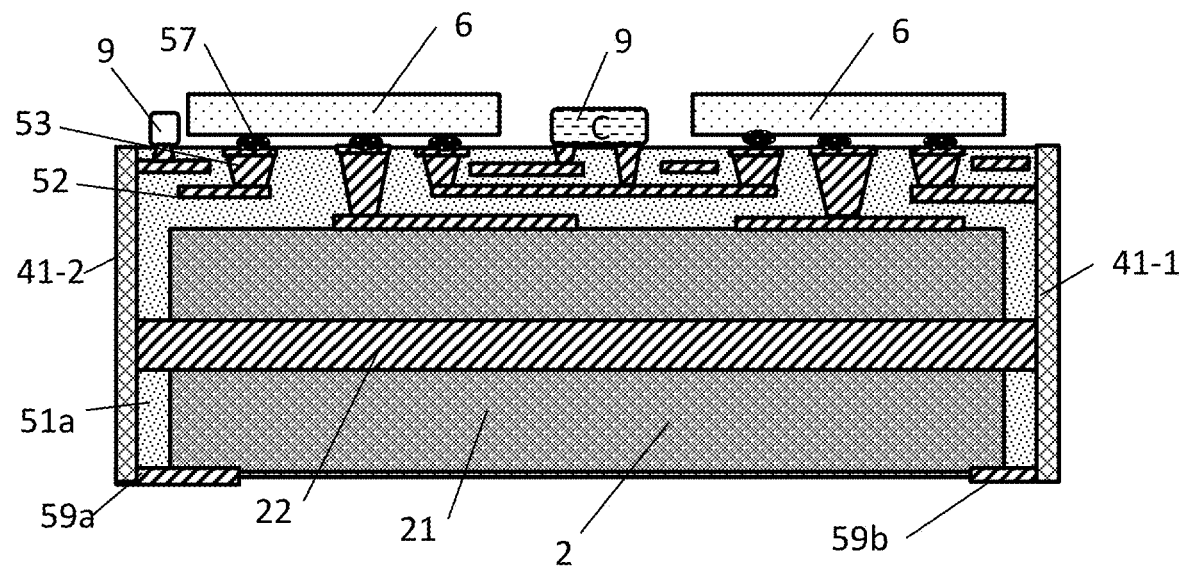
Figure 18C:
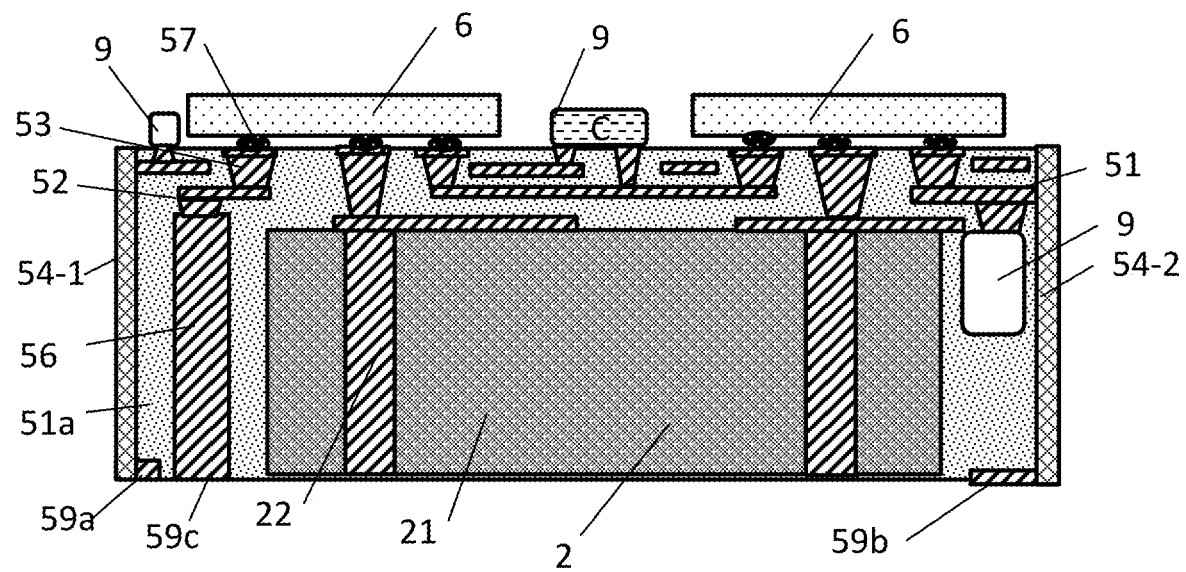

The main difference between FIG. 18b or 18c and FIG. 18a lies in that both of the inductor 2 and the conductive layer 52 are embedded in the first insulating layer 51a, and the inductor 2 is electrically connected to the conductive layer 52 through a packaged metallization process instead of being electrically connected to the conductive layer through a solder joint. Then, a terminal is provided on the upper surface of the packaging material, and chips 6 are disposed above, and the chips 6 are electrically connected to the conductive layer 52 and the inductor 2 through the solder joints 57.

Figure 19:
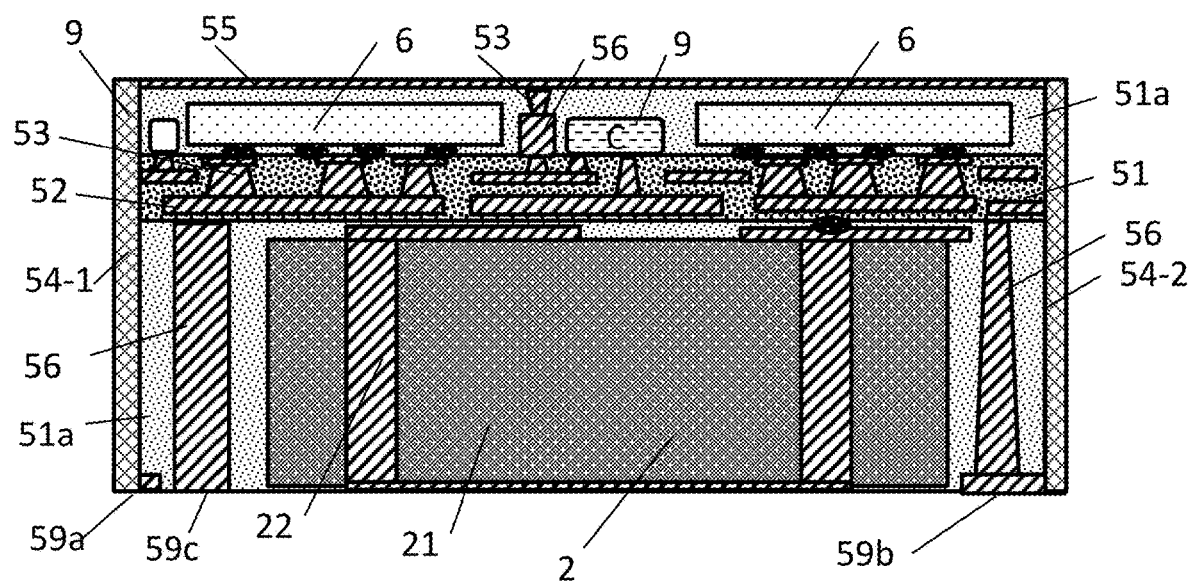
FIG. 19 is a schematic structural view of a fifth power supply module according to another embodiment of the present disclosure.

The main difference between FIG. 19 and FIG. 18a lies in that the chips 6 are covered by the second insulating layer 51b of the main insulator 51, which is advantageous for better protection of the chip 6, and facilitates heat conduction between the upper surface of the chip 6 and the upper surface of the power supply module. For example, an exposed conductive layer 55 is formed on the upper surface of the power supply module, and the exposed conductive layer 55 can be electrically connected to the GND of the power supply module, or the transmission of the input current; if it is connected to the GND, the exposed conductive layer 55 and the upper surface of the chip 6 can be connected to form a good heat dissipation channel.

The main difference between FIG. 19 and FIG. 15 lies in that after the chip 6 is attached to the substrate 5 in a surface-mount manner, it is covered by the second insulating layer 51b to form a package.

Figure 20:
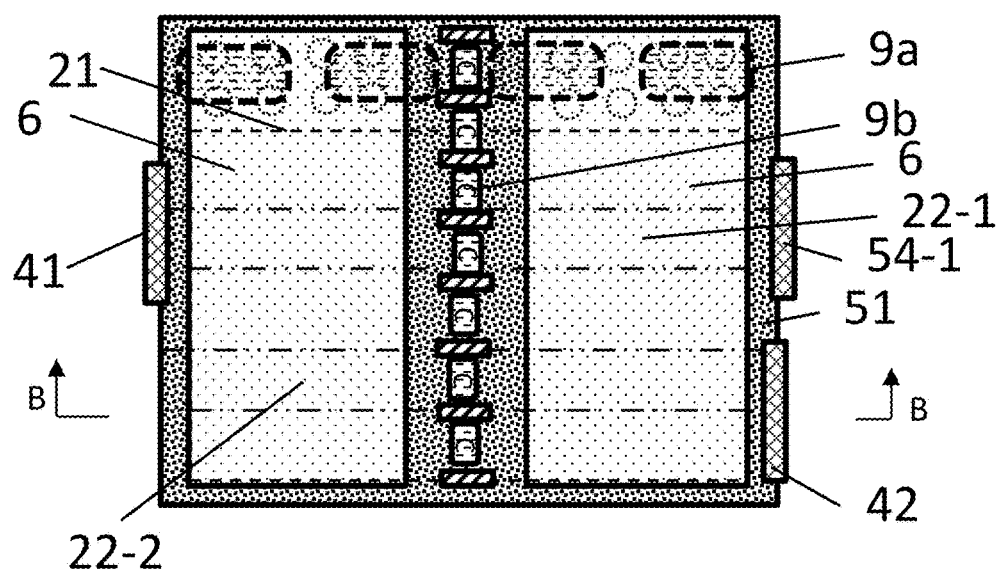
FIG. 20 is a schematic structural view of a sixth power supply module according to another embodiment of the present disclosure.
Figure 21:
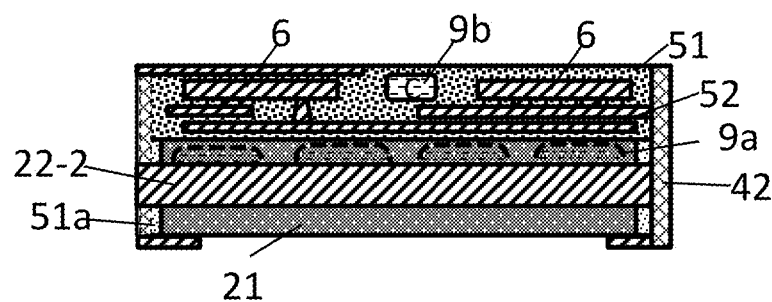
FIG. 21 is a sectional view taken along B-B in FIG. 20.

FIG. 20 is a top view of an embodiment of a two-phase integrated power supply module on the basis of the embodiments illustrated in FIGS. 14 to 19. FIG. 21 is a sectional view of FIG. 20. The two-dot chain line in FIG. 20 indicates the winding 22 of the inductor 2. A first winding 22-1 of the inductor 2 is electrically connected to the conductive member 41, and a second winding 22-2 is electrically connected to the conductive member 42, and the square dotted line in FIG. 20 (where a part of the square dotted line coincides with the outline of the main insulator 51) indicates the magnetic core 21 of the inductor 2, and the elliptical dotted line indicates other components 9a mounted on the lower surface of the substrate 5, such as capacitors, and the circular dotted line indicates a signal pad of the chip 6, and a capacitor 9b may also be provided between the chips 6. If the chip 6 has a half bridge circuit therein, if the conductive member 41 and the conductive member 42 are electrically connected to the SW terminals of the half bridge circuits in the two chips 6, respectively, this structure can form two oppositely coupled power supply modules.

Figure 22A:
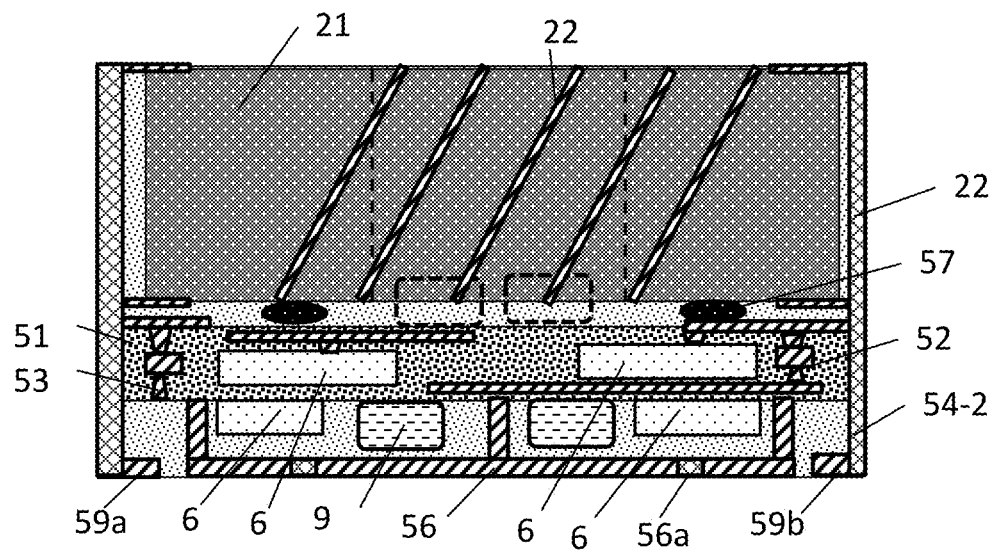
FIG. 22a is a schematic structural view of a seventh power supply module according to another embodiment of the present disclosure.
Figure 22B:
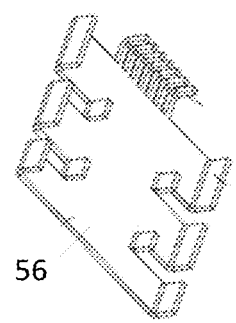
FIG. 22b is a first schematic structural view of a leadframe according to another embodiment of the present disclosure.
Figure 22C:
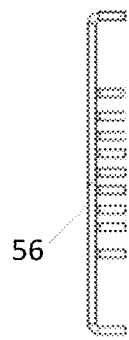
FIG. 22c is a second schematic structural view of a leadframe according to another embodiment of the present disclosure.

As shown in FIG. 22a, a transformer 29 is embedded in the first insulating layer 51a, and the conductive connecting member 54-1 or 54-2 penetrates through the power supply module to electrically connect the winding 22 of the transformer 29 and the conductive layer 52 or the conductive pad 59 in the substrate 5. In addition, the chip 6 can be embedded in the substrate 5, and of course, a chip or other components can be provided on the lower surface of the substrate 5. A leadframe 56 may also be provided on the lower surface of the substrate 5 to achieve electrical connection between the substrate 5 and the bottom of the power supply module. The structure of the leadframe may be conventionally arranged, and the leadframe may be as shown in FIGS. 22b and 22c. This leadframe 56 is soldered to the substrate 5, and then filled with insulated packing materials to form a first insulating layer 51a. Then a groove 56a is formed on the lower surface of the leadframe 56 to electrically divide the leadframe 56 into a plurality of conductive pads. In addition, the conductive connecting member 54-1 or 54-2 can also serve as a winding of the transformer 29, thus simplifying the structure or producing process of the transformer and making the power supply module compact and simplified.

The main difference between FIG. 23a and FIG. 22a lies in that the upper and lower positions of the substrate 5 and the transformer 29 are exchanged, that is, the substrate 5 is located above, the transformer 29 is located below, and the conductive pad 59a or 59b is provided on the side of the transformer 29. The chips 6 may be embedded in the substrate 5 or may be mounted on the surface of the substrate 5, for example, on the upper surface of the substrate 5. In the figure, the chip 6a and other components 9 may be mounted on the upper surface of the substrate 5 where the chip 6 is embedded. Of course, the chip 6a and other components 9 may also be covered with an insulated packing material 51a (not shown) to enhance the protection of the chip 6a and other components 9, and also to facilitate the installation of the heatsink located above through the formation of a complete upper surface. The conductive connecting members 54-1 and 54-2 connect the conductive layer 52 in the substrate 5 and the winding 22 of the transformer, and may also electrically connect the conductive layer 52 or the winding 22 of the transformer 29 to the conductive pad 59a or 59b.

Figure 23A:
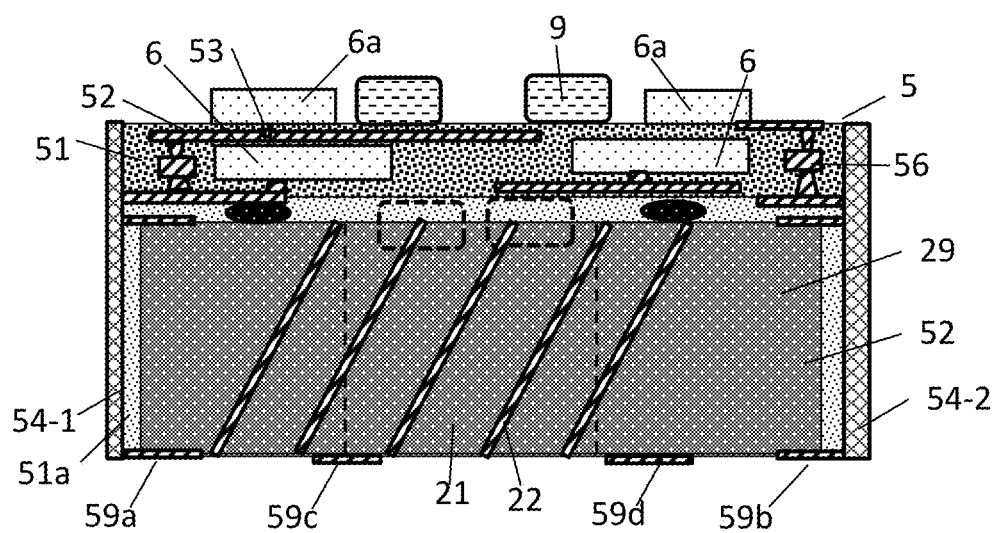
FIGS. 23a and 23b are schematic structural views of an eighth power supply module according to another embodiment of the present disclosure.
Figure 23B:
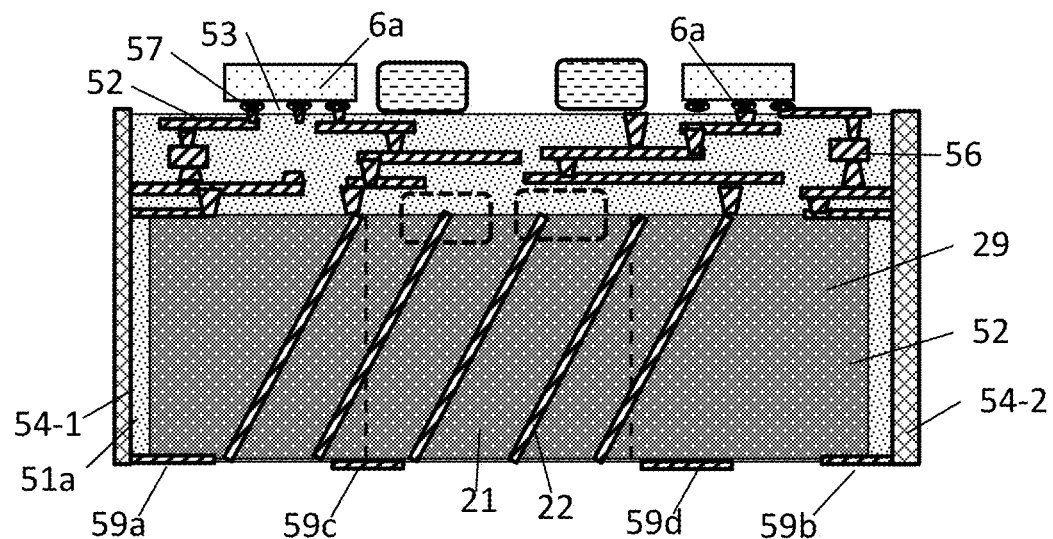

The main difference between FIG. 23b and FIG. 23a lies in that both of the transformer 29 and the conductive layer 52 are embedded in the first insulating layer 51, and the transformer 29 is electrically connected to the conductive layer 52 through a packaged metallization process instead of being electrically connected to the conductive layer through solder joints. Then, a terminal is provided on the upper surface of the packaging material, and a chip 6 is disposed above, and the chip 6 is electrically connected to the conductive layer 52 and the inductor 2 through the solder joint 57.

In the examples of the above embodiments, examples are taken where the passive component is an inductor or a transformer. In other examples, the passive component may also be a capacitor, or a combination of the above passive components. The winding of the inductor can be parallel to the surface of the chip or perpendicular to the surface of the chip. The transformer can be a planar transformer or a foil-wound transformer (such as a flat-wound transformer). With this arrangement, the structure of the power supply module is more compact; besides, since the solder joint for the electrical connection between the passive component and the conductive layer 52 is no longer required, the overall height of the package structure can be reduced, and the resistance of the connection between the passive component and the conductive layer can be reduced, thereby providing efficiency. In addition, when the passive component is embedded in the packing material, the precision requirement on the process can be reduced compared to the chip embedded, which is beneficial to reduce the cost. The chip is provided above to facilitate heat dissipation of the upper side through the heatsink.

Figure 13A:
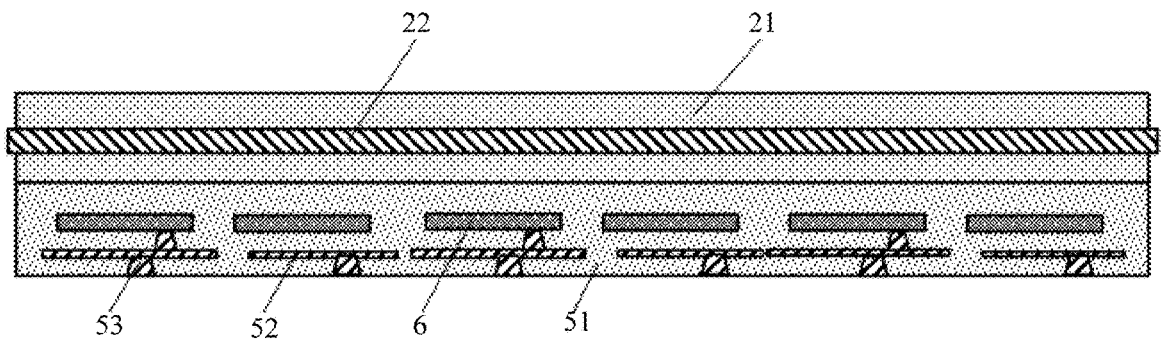
FIGS. 13a to 13d are schematic flowcharts of a process for fabricating a power supply module according to an embodiment of the present disclosure.
Figure 13B:
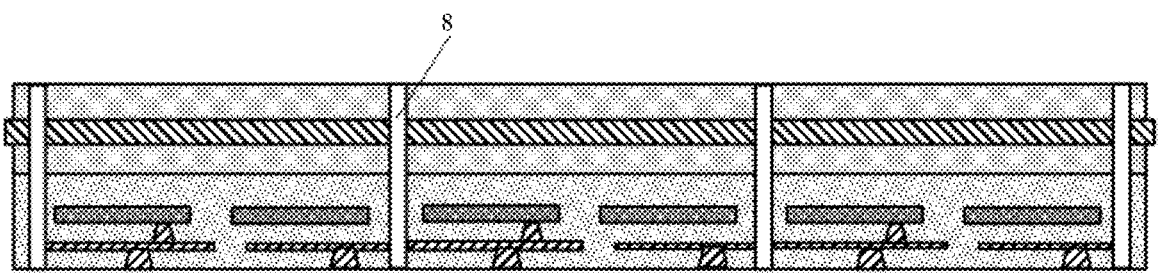
Figure 13C:
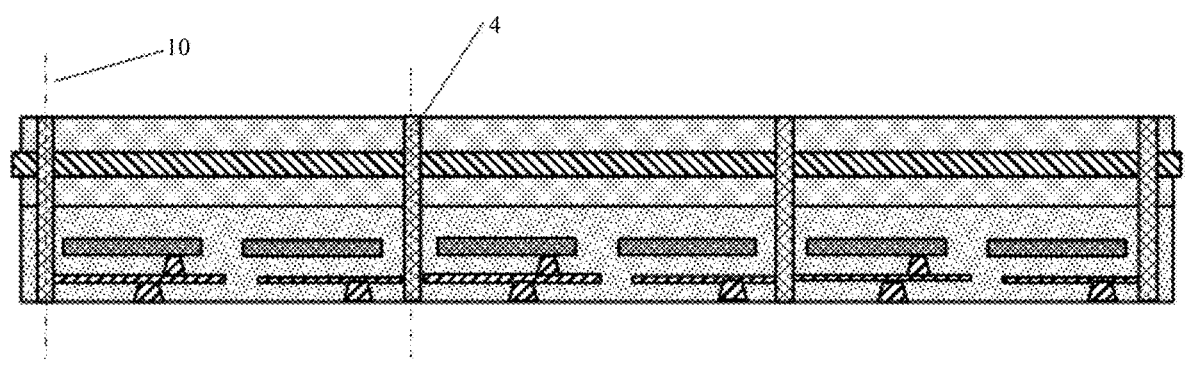
Figure 13D:
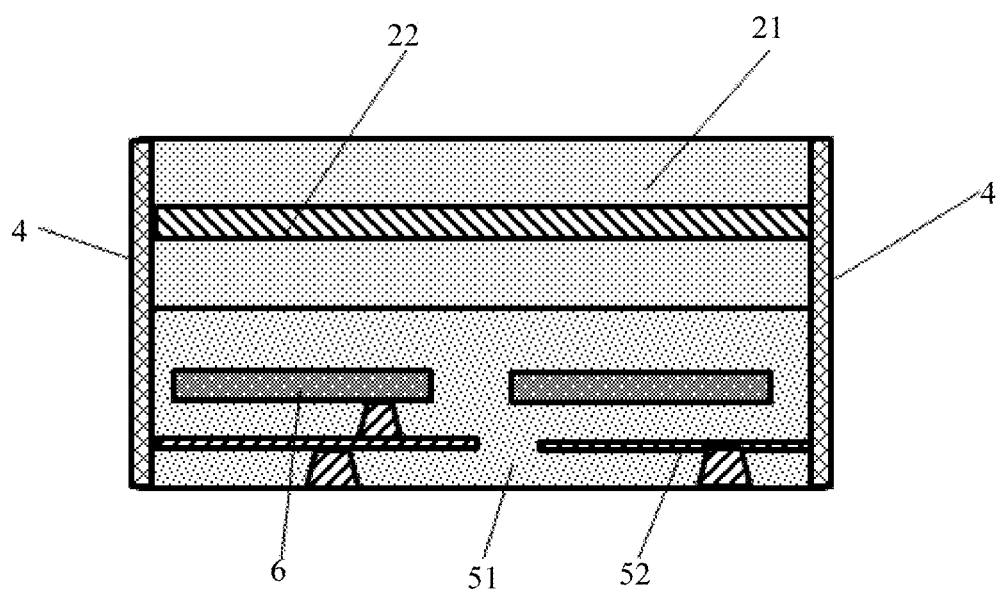

FIGS. 13a-13d illustrate a panel production process. In the description, the passive element 1 is illustrated as an inductor 2 by way of example. In panel magnetic core 21, a winding 22 is provided, the magnetic core 21 being stacked with a main insulator 51 which in turn is formed from the insulating packaging material of the substrate 5. A plurality of chips 6, and a conductive layer 52 connected thereto, are embedded in the main insulator 51 formed from the insulating packaging material. The via 53 forms on the bottom of the substrate 5 the pad as the output terminal of the power supply module, or electrically connects the conductive layer 52 to the chip 6. In FIG. 13b, cutting or drilling is applied to the above panel structure at a predefined location to form a first groove 8. The first groove 8 may be a via, a stamped hole, a long slotted hole, a rectangular groove, a waveform groove or the like. Further, the entire panel may be cut into various separated parts. Alternatively, a film may be provided on the bottom before the cutting, such that the film remains uncut even if the panel structure has been cut. The film may be attached onto a platform by way of, e.g., vacuum suction, to maintain the integrity of the panel even after the cutting, so as to facilitate the manufacture of the unibody conductive member 4 later. FIG. 13c illustrates a unibody conductive member 4, which is formed in the first groove 8 located at the inner side (e.g., the via) or on a side wall (e.g., stamp holes or end face) by way of, e.g., electroplating, spraying, metal deposition, physical deposition, chemical deposition, or conductive material filling or other metallization methods, the conductive member 4 being in contact with the conductive part 22 and the conductive layer 52. The panel is cut and separated along the cutting line 10, finally forming the power supply module shown in FIG. 13d. This process flow is simple and highly efficient, which is advantageous in reducing the manufacture cost for the power supply module. Moreover, the fabricated power supply modules exhibit good consistency.

In the foregoing embodiments, the conductive layer 52 may be electrically connected to the chip 6 through various forms, e.g., a conductive trace that is connected to the chip 6 through some other pathways or components. The specific connection may be chosen as practically needed.

In the foregoing embodiment structures, glue may be filled between the passive element 1 and the substrate 5 to reinforce the connection in between. The chip 6 may also be packaged on the basis of the inductor 2 or the capacitor 3 to form the substrate 5. Alternatively, the inductor 2 or capacitor 3 may be stacked on the basis of the substrate 5.

In the foregoing embodiments, it may be preferred to bury the chip 6 into the main insulator 51 formed from insulating packaging material. In practical application, the chip 6 may also be provided on the surface of the substrate 5 and be connected through the conductive layer 52, via 53 or the like to the conductive part 32 of the energy storage element.

In the foregoing embodiments, at least two of the plurality of conductive layers 52 may be placed within the same layer and mutually insulated from each other, or placed in different layers.

In stacked structures of the passive element and the conductive layer as described in the present disclosure, the projections of the passive element and the conductive layer in the direction perpendicular to the surface of the substrate may overlap entirely, partially or none at all. Meanwhile, the conductive member is used to contact the conductive part in the passive element to the conductive layer, realizing the electrical connection between the conductive part in the passive element and the conductive layer.

Figure 24A:
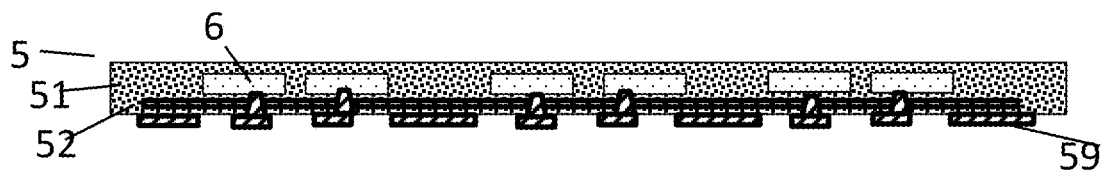
FIGS. 24a to 24e are schematic flowcharts of another process for fabricating a power supply module according to an embodiment of the present disclosure.
Figure 24B:
Figure 24C:
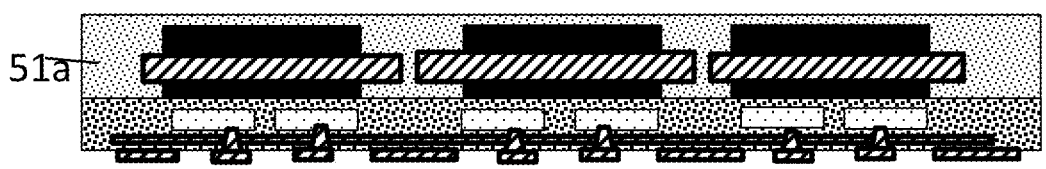
Figure 24D:
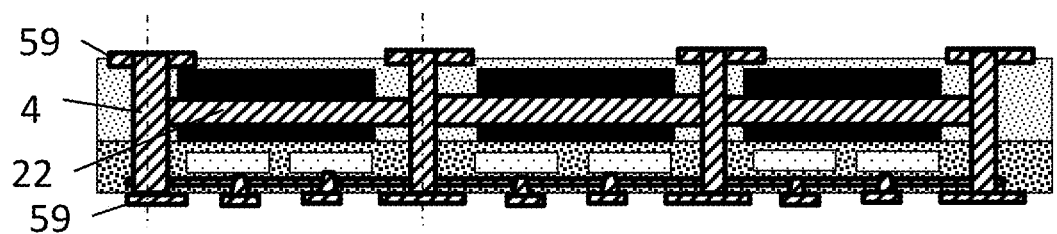
Figure 24E:
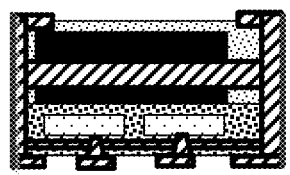

FIGS. 24a to 24e illustrate a manufacture process. In FIG. 24a, a panel substrate 5 is provided. A conductive layer 52 is provided in the substrate 5. In some embodiments, a chip 6 may be embedded in the main insulator 51 of the substrate 5. In other embodiments, the chip 6 may be mounted on the surface of the substrate 5. In some embodiments, the conductive pad 59 may be formed in advance at the bottom. In FIG. 24b, the passive element 1, such as an inductor, is soldered on the upper surface of the substrate 5, and can be arranged correspondingly according to the panel structure of the substrate 5. The passive element 1 and the substrate 5 form a stacked structure. In FIG. 24c, the passive element 1 is covered with a first packaging layer 51a made of an insulated packing material, for example by means of molding or the like. FIG. 24d illustrates the producing of the conductive member 4, for example, the first groove may penetrate through the lower surface of the passive element 1 and be in contact with the conductive layer 52 and the conductive part, and the first groove may be a via or a blind embedded hole, and then the conductive member 4 is formed in the first groove through electroplating, which electrically connects the conductive part of the passive element 1 to the conductive layer 52 in the substrate. On the lower surface of the substrate 5 or the upper surface of the first insulating layer 51a, the conductive pad 59 may be formed separately or simultaneously on both surfaces. The panel is cut at the position of the cutting line in FIG. 24d. The cut module forms a power supply module as shown in FIG. 24e, that is, the conductive pad 59 may be formed on the side of the substrate 5, or the conductive pad 59 may be formed on the side of the passive element 1, or the conductive pads can be formed on both of the upper and lower surfaces simultaneously to form a power supply module with a double-sided terminal. Other treatments such as cleaning or an oxidation treatment may be performed on the surface of the power supply module if necessary.

Figure 25A:
FIGS. 25a to 25e are schematic flowcharts of still another process for fabricating a power supply module according to an embodiment of the present disclosure.
Figure 25B:
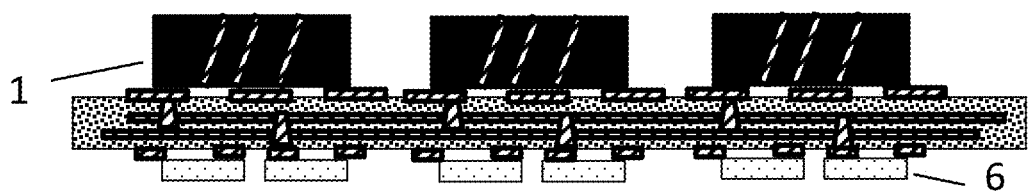
Figure 25C:
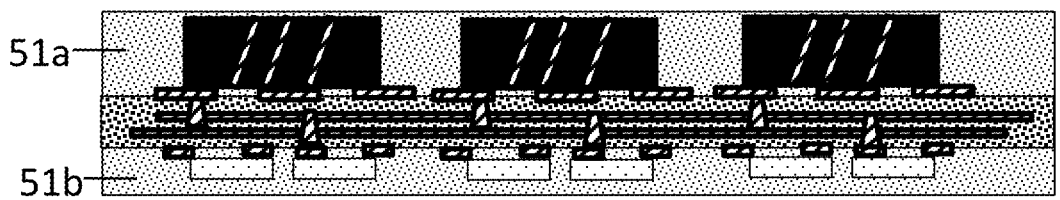
Figure 25D:
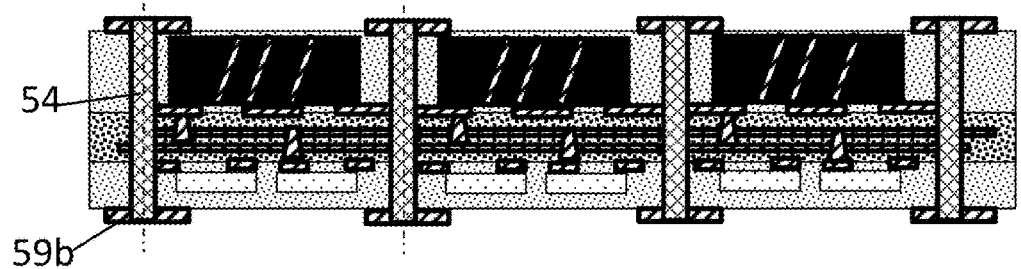
Figure 25E:
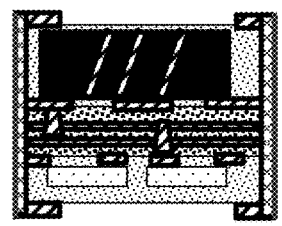

FIGS. 25a to 25e illustrate a manufacture process. In FIG. 25a, a panel substrate 5 is provided. A conductive layer is provided in the substrate 5. Further, conductive pads 59, such as 59-1 and 59-2, may be formed in advance on the upper and lower surfaces of the substrate. In FIG. 25b, the passive element 1, such as a transformer, is soldered on the upper surface of the substrate 5, and can be arranged correspondingly according to the panel structure of the substrate 5. The passive element 1 and the substrate 5 form a stacked structure, and the solder chip 6 can also be soldered on the lower surface of the substrate 5. Other components can be provided on the upper and lower surfaces. In FIG. 25c, the passive element 1 and the chip 6 are covered with an insulated packing material, for example by means of molding on the upper and lower surfaces of the substrate 5. FIG. 25d illustrates the producing process of the conductive member 54, for example, the second groove may penetrate through the lower surface of the passive element 1 and be in contact with the conductive layer 52 and the conductive part, and the second groove may be a via or a blind embedded hole, and then the conductive connecting member 54 is formed in the first groove through electroplating, which electrically connects the conductive part of the passive element 1 to the conductive layer 52 in the substrate, and forms the conductive pad 59 on the lower surface of the entire panel, or forms the conductive pad 59 on the upper surface, or the conductive pads 59 are provided on both surfaces. The panel is cut at the position of the cutting line in FIG. 25d. The cut module forms a power supply module as shown in FIG. 25e, that is, the conductive pad 59 may be formed on the side of the chip 6, or the conductive pad 59 may be formed on the side of the passive element 1, or the conductive pads can be formed on both of the upper and lower surfaces simultaneously to form a power supply module with a double-sided terminal. Other treatments such as cleaning or an oxidation treatment may be performed on the surface of the power supply module if necessary. It should be noted that the conductive connecting member 54 can serve as a part of the winding of the transformer or electrically connect the conductive layer 52 to the winding of the transformer.

Figure 26A:
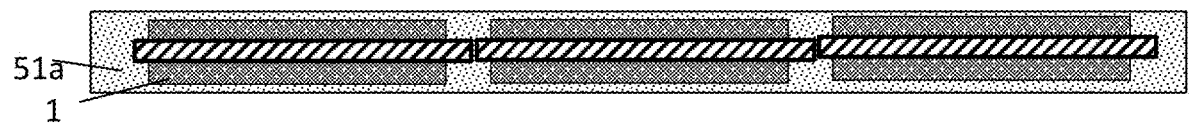
FIGS. 26a to 26c are schematic flowcharts of still another process for fabricating a power supply module according to an embodiment of the present disclosure.
Figure 26B:
Figure 26C:
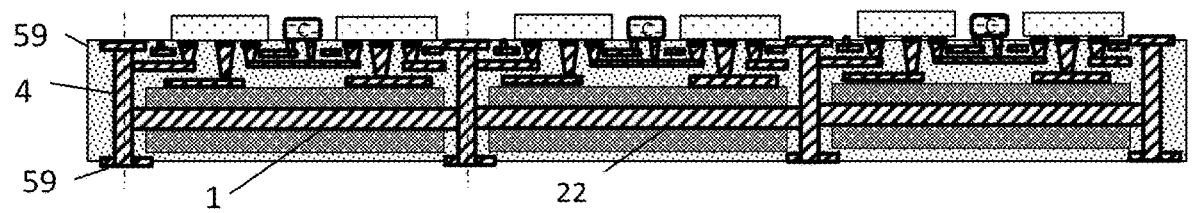

FIGS. 26a to 26c illustrate a manufacture process. In FIG. 26a, a panel substrate 5 is provided. The passive element 1 is embedded in the substrate 5. The inductor is taken as an example in the figure, and may of course be a capacitor or a transformer. In FIG. 26b, a conductive layer 52 is formed on the upper surface of the substrate 5 through a packaging process, for example, a redistribution layer (RDL) is fabricated, and terminals are provided on the upper surface. FIG. 26c illustrates the soldering of the chip 6 on the upper surface, for example by means of SMT and reflow; FIG. 26c also illustrates the producing process of the conductive member 4, for example, the first groove may be processed to penetrate through the upper surface of the passive element 1 and be in contact with the conductive layer 52 and the conductive member 22, and the processed first groove may be a via or a blind embedded hole, and then the conductive member 4 is formed in the first groove through electroplating, which electrically connects the conductive part of the passive element 1 to the conductive layer 52 in the substrate, and the conductive pad 59 is provided on the lower surface of the substrate 5 as a terminal to which the module is connected externally. The panel is cut at the position of the dicing line indicated by the dotted line in FIG. 26c, and the cut module forms a power supply module as shown in FIG. 18b, 18c or 23b. Other treatments such as cleaning or an oxidation treatment may be performed on the surface of the power supply module if necessary. In FIG. 26c, the order of the processes of soldering the chip 6, forming the unibody conductive member 4, cutting the panel at the position of the cutting line indicated by the dotted line can be adjusted according to practical applications.

Figure 14A:
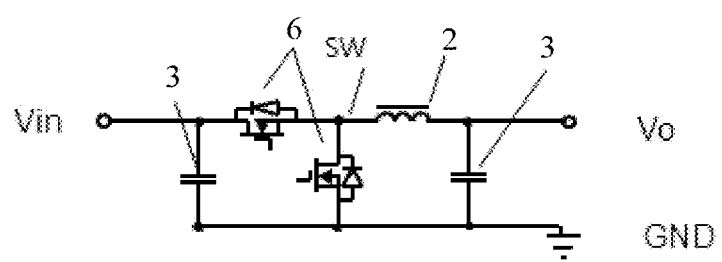
FIGS. 14a to 14c are schematic circuit diagrams of three optional circuits provided in embodiments of the present disclosure.
Figure 14B:
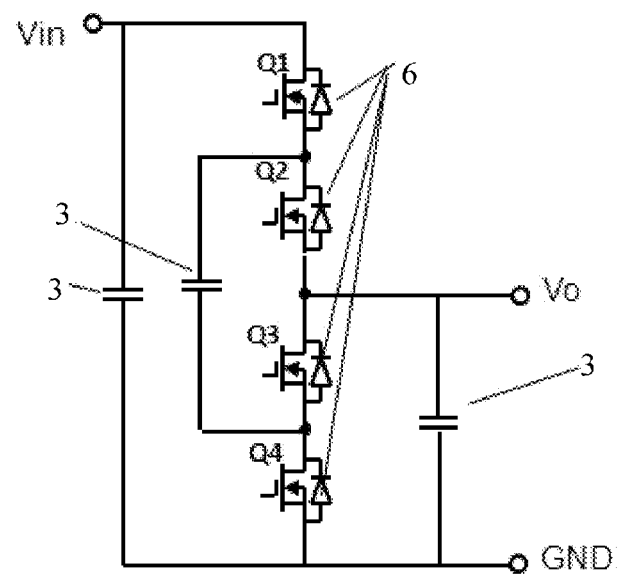
Figure 14C:
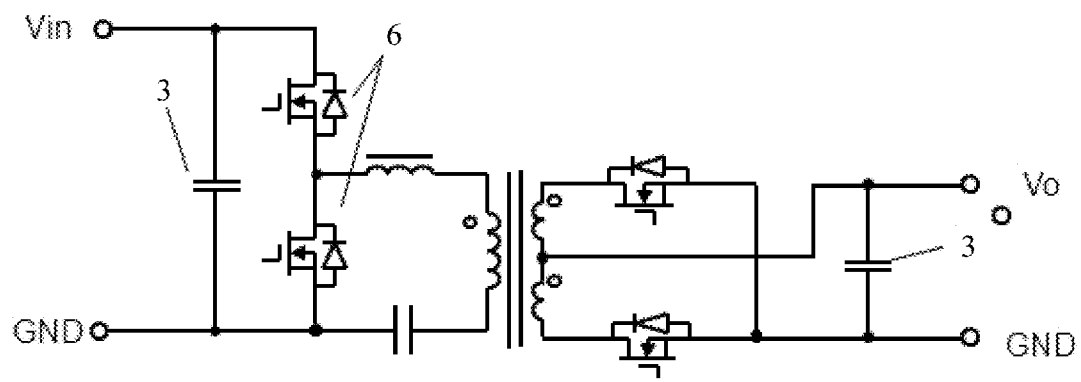

The present embodiment may be applicable to the relevant circuits depicted in FIGS. 14a to 14c, but is not limit thereto. FIG. 14a illustrates a buck circuit, FIG. 14b illustrates a switching capacitor circuit, and FIG. 14c illustrates an LLC circuit.

Although the present disclosure has been described with reference to several typical embodiments, it should be understand that the terms are explanatory and illustrative rather than restrictive. Since the present disclosure may be implemented in various forms without departing from its spirit or essence, it should be understand that the above embodiments are not limited to any of the foregoing details. Instead, they shall be broadly construed within the spirit and scope as defined by the appended claims. Therefore, all variations or modifications that fall into the claims or an equivalent scope should be covered by the appended claims.

Finally, it should be noted that the foregoing embodiments are merely intended for describing, rather than limiting, the technical solutions of the present disclosure. Although the present disclosure has been described in detail with reference to the foregoing embodiments, persons of ordinary skill in the art should understand that they may still make modifications to the technical solutions described in the foregoing embodiments, or make equivalent replacements to some or all technical features therein; however, these modifications or replacements do not make the essence of corresponding technical solutions depart from the scope of the technical solutions in the embodiments of the present disclosure.

What is claimed is:

1. A power supply module, comprising: a substrate, a passive element and a unibody conductive member, wherein a conductive layer is formed in the substrate; the passive element and the conductive layer are provided in a stacking manner, the passive element comprising a conductive part and an energy storage part; and the conductive member penetrates through a surface of the energy storage part facing the conductive layer, and the conductive member is in contact with the conductive part and the conductive layer respectively.

2. The power supply module according to claim 1, wherein the conductive member penetrates through the energy storage part.

3. The power supply module according to claim 1, wherein the passive element is provided internally in the substrate; or, the passive element is provided externally out of the substrate.

4. The power supply module according to claim 1, wherein at least one lateral side of the power supply module is provided in full with the conductive member; or, at least one lateral side of the power supply module is provided in part with the conductive member.

5. The power supply module according to claim 1, wherein the power supply module is provided internally with at least one inner bore connected with the conductive part and the conductive layer, the conductive member being provided within the inner bore.

6. The power supply module according to claim 1, wherein the power supply module is provided on a lateral side with at least one first groove connected the conductive part and the conductive layer, the conductive member being provided within the first groove.

7. The power supply module according to claim 6, wherein
the conductive member fills up an entirety of the first groove; or, the conductive member covers an inner wall of the first groove.

8. The power supply module according to claim 6, wherein the first groove comprises a plurality of arc grooves, at least some of the plurality of arc first grooves are provided with interval spacing; or, at least some of the plurality of arc first grooves are provided connected.

9. The power supply module according to claim 1, further comprising a conductive pad configured to input or output an electric current, the conductive pad being electrically connected to the conductive layer via a conductive connecting member or the conductive member.

10. The power supply module according to claim 9, wherein the passive element is provided internally in the substrate, and the conductive pad is exposed on a surface of the substrate.

11. The power supply module according to claim 9, wherein the passive element is provided externally out of the substrate, and the conductive pad is exposed on a surface of the substrate or a surface of the passive element.

12. The power supply module according to claim 1, wherein the substrate is provided internally with a chip, and the conductive layer is electrically connected to the chip.

13. The power supply module according to claim 1, wherein the conductive member comprises a first conductive member and a second conductive member, which are oppositely provided, and the conductive layer is in contact with at least one of the first conductive member and the second conductive member.

14. The power supply module according to claim 13, wherein the conductive layer comprises: a first conductive layer and a second conductive layer, the first conductive layer being in contact with the first conductive member, and the second conductive layer being in contact with the second conductive member.

15. The power supply module according to claim 1, wherein the energy storage part comprises a magnetic core, the conductive part comprises a winding, and at least a part of the winding is located within the magnetic core, the magnetic core and the winding provided in the magnetic core forms an inductor.

16. The power supply module according to claim 1, wherein the energy storage part comprises a dielectric part; the conductive part comprises a first plate electrode and a second plate electrode, which are oppositely arranged, with the dielectric part being provided in between, forming a capacitor with the first plate electrode and the second plate electrode; the conductive member comprises a first conductive member and a second conductive member; the first conductive member passes through the dielectric part and is in contact with the first plate electrode and the conductive layer separately, and the second conductive member is in contact with the second plate electrode and the conductive layer.

17. The power supply module according to claim 16, wherein the conductive layer comprises: a first conductive layer and a second conductive layer, the first conductive member being in contact with the first plate electrode and the first conductive layer separately, and the second conductive member being in contact with the second plate electrode and the second conductive layer separately.

18. The power supply module according to claim 17, wherein the energy storage part further comprises a magnetic core, the conductive part further comprises a winding, and at least a part of the winding is located within the magnetic core, the magnetic core and the winding provided in the magnetic core forms an inductor; the conductive member further comprises a third conductive member and a fourth conductive member, the conductive layer further comprises a third conductive layer, wherein the third conductive member penetrates through a surface of the magnetic core facing the third conductive layer, and the third conductive member is in contact with the winding and the third conductive layer separately.

19. The power supply module according to claim 1, further comprising a conductive pad configured to offer an external electrical connection, and the conductive pad is disposed on at least one of an upper surface of the power supply module and a lower surface of the power supply module.

20. A manufacture method of a power supply module according to claim 1, comprising:

providing a substrate comprising a conductive layer;

stacking the conductive layer with the passive element, the passive element comprising a conductive part and an energy storage part;

providing a first groove connected the conductive layer and the conductive part; and forming within the first groove a unibody conductive member for electrically connecting the conductive layer with the conductive part, wherein the conductive member penetrates through a surface of the energy storage part facing the conductive layer, and the conductive member is in contact with the conductive part and the conductive layer respectively.

* * * * *